(12) United States Patent
Imahashi

(10) Patent No.: US 8,188,568 B2
(45) Date of Patent: May 29, 2012

(54) SEMICONDUCTOR INTEGRATED CIRCUIT

(75) Inventor: Manabu Imahashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/022,035

(22) Filed: Feb. 7, 2011

(65) Prior Publication Data

US 2011/0254120 A1   Oct. 20, 2011

(30) Foreign Application Priority Data

Apr. 20, 2010   (JP) ................................. 2010-097306

(51) Int. Cl.
*H01L 21/70* (2006.01)

(52) U.S. Cl. ......... 257/526; 257/173; 257/565; 257/587

(58) Field of Classification Search .................. 257/355, 257/358, 361–363, 552, 593, 173, 526, 565, 257/587

See application file for complete search history.

(56) References Cited

U.S. PATENT DOCUMENTS

| | | | |
|---|---|---|---|
| 5,506,156 A | 4/1996 | Watanabe et al. | |
| 5,751,053 A | 5/1998 | Honda | |
| 5,847,440 A | 12/1998 | Yamamoto | |
| 5,962,913 A | 10/1999 | Honda | |
| 7,202,531 B2 * | 4/2007 | Imahashi et al. | 257/355 |
| 7,675,141 B2 * | 3/2010 | Otake | 257/565 |
| 7,719,081 B2 * | 5/2010 | Soma et al. | 257/511 |
| 7,791,171 B2 * | 9/2010 | Soma et al. | 257/565 |
| 7,825,442 B2 * | 11/2010 | Nakaya | 257/288 |
| 7,932,580 B2 * | 4/2011 | Soma et al. | 257/565 |
| 2007/0210419 A1 | 9/2007 | Nawate et al. | |

FOREIGN PATENT DOCUMENTS

| | | |
|---|---|---|
| JP | 2004-335634 | 11/2004 |
| JP | 2007-242923 | 9/2007 |

* cited by examiner

*Primary Examiner* — Steven Loke
*Assistant Examiner* — Victoria Hall
(74) *Attorney, Agent, or Firm* — McDermott Will & Emery LLP

(57) ABSTRACT

A semiconductor circuit includes: a first diffusion layer formed on a substrate; a second diffusion layer formed in an upper part of the first diffusion layer; a third diffusion layer formed in an upper part of the second diffusion layer; a fourth diffusion layer formed in the upper part of the first diffusion layer; and a fifth diffusion formed below the third diffusion layer. A sum of a shortest distance from the third diffusion layer to the fifth diffusion layer and a shortest distance from the fifth diffusion layer or the lower end of the first diffusion layer to the fourth diffusion layer is smaller than a shortest distance from the third diffusion layer to the fourth diffusion layer. The substrate, the second and the fifth diffusion layer are a first conductivity type and the others are a second conductivity type.

10 Claims, 22 Drawing Sheets

SEMICONDUCTOR INTEGRATED CIRCUIT

CROSS-REFERENCE TO RELATED APPLICATION

This application claims priority to Japanese Patent Application No. 2010-97306 filed on Apr. 20, 2010, the disclosure of which including the specification, the drawings, and the claims is hereby incorporated by reference in its entirety.

BACKGROUND

The present invention relates to semiconductor integrated circuits, and more particularly to semiconductor integrated circuits including an electrostatic protection device.

With recent increased miniaturization and integration density in semiconductor integrated circuit processes, reduction in size has also been desired for electrostatic protection devices for protecting semiconductor integrated circuits from static electricity carried by human bodies, machines, etc. In order to protect the semiconductor integrated circuits from static electricity, the electrostatic protection devices are connected to an input/output (I/O) terminal and a power supply terminal of the semiconductor integrated circuits. A bipolar or metal oxide semiconductor (MOS) transistor structure, etc. is used in the electrostatic protection devices (see, e.g., Japanese Patent Publication No. 2004-335634).

A conventional electrostatic protection device using an npn bipolar transistor structure will be described with reference to FIGS. 21-22.

As shown in FIG. 21, a p-type diffusion layer 105 serving as a base of an npn transistor is formed in the upper part of an n-type low concentration semiconductor substrate 103, and an n-type high concentration diffusion layer 106 serving as an emitter of the npn transistor is formed in the upper part of the p-type diffusion layer 105. A p-type high concentration diffusion layer 107 serving as a base contact is formed in a region separated from the n-type high concentration diffusion layer 106 in the upper part of the p-type diffusion layer 105. An n-type high concentration diffusion layer 108, serving as a collector contact and having about the same depth as the n-type high concentration diffusion layer 106, is formed in a region laterally separated from the p-type diffusion layer 105 by a predetermined distance in the upper part of the n-type low concentration semiconductor substrate 103. A local oxidation of silicon (LOCOS) film 121 is formed between the p-type diffusion layer 105 and the n-type high concentration diffusion layer 108 in the upper part of the n-type low concentration semiconductor substrate 103. An emitter electrode 131 forms an ohmic connection to the n-type high concentration diffusion layer 106, a base electrode 132 forms an ohmic connection to the p-type high concentration diffusion layer 107, and a collector electrode 133 forms an ohmic connection to the n-type high concentration diffusion layer 108. The base electrode 132 and the emitter electrode 131 are short-circuited together via an aluminum interconnect, etc., and are connected to the lowest potential such as the ground (GND). The collector electrode 133 is connected via an aluminum interconnect, etc. to an input/output (I/O) pad (PAD) 130 and an internal circuit 140 that are formed on a substrate of a semiconductor integrated circuit.

As shown in FIG. 22, when positive surge charge due to static electricity, etc. is applied from the I/O PAD 130 to the collector electrode 133 of the npn transistor having the above configuration, a current produced by avalanche breakdown flows between the collector and the base (a collector-base breakdown voltage: $BV_{CBO}$). Then, the base potential increases to the operating voltage of the npn transistor, and the npn transistor starts a bipolar operation (a trigger point: a trigger voltage $V_{t1}$, a trigger current $I_{t1}$). When the current increases, the number of electrons injected from the n-type high concentration diffusion layer 106 into a region located below the n-type high concentration diffusion layer 106 in the n-type low concentration semiconductor substrate 103 becomes excessive as this region has a low impurity concentration. In order to neutralize the excess electrons, holes are injected from the p-type diffusion layer 105 into this region, whereby this region functions as a base. At this time, since this region is not an n-type layer but a neutral region, the collector potential decreases from the trigger voltage $V_{t1}$ to a holding voltage $V_h$ between the collector and the emitter, which is dependent on the current gain (hFE) of the npn transistor at this time. In this npn transistor structure, the current path between the collector and the emitter is short because the current flows near the surface of the n-type low concentration semiconductor substrate 103. That is, since the base width is narrow, and hFE is high at this time, the holding voltage $V_h$ decreases significantly as compared to the trigger voltage $V_{t1}$. Then, the collector potential increases from the holding voltage $V_h$ to a breakdown voltage $V_{t2}$ according to the collector resistance that is dependent on the n-type high concentration diffusion layer 108. If the current further increases thereafter, thermal runaway is caused by heat generated at the end on the base side of the n-type high concentration diffusion layer 108 due to current concentration, resulting in breakdown (a breakdown point: a breakdown voltage $V_{t2}$, breakdown endurance $I_{t2}$).

In addition, electrostatic protection devices suitable for protecting high breakdown voltage elements have been proposed in Japanese Patent Publication No. 2007-242923. These electrostatic protection devices maintain a high holding voltage by using such a structure that increases an apparent base width.

SUMMARY

The conventional electrostatic protection devices have poor protection capability as most of the current path is present near the surface of the n-type low concentration semiconductor substrate, and the current tends to be concentrated in the region near that surface and thus the breakdown endurance $I_{t2}$ is reduced. In order to increase the breakdown endurance $I_{t2}$, it is necessary to increase the emitter area, namely the area of the protection device, to relatively reduce the current density, which increases the chip size. Another problem is the low holding voltage due to the narrow base width and high hFE in the bipolar operation. Thus, the conventional electrostatic protection devices are not suitable for protecting high breakdown voltage elements.

In view of the above problems, it is an object of the present invention to enable a semiconductor integrated circuit including an electrostatic protection device having high breakdown endurance and a high holding voltage to be obtained without increasing the area of the electrostatic protection device.

Regarding the semiconductor conductivity types described below, each of first and second conductivity types indicates one of p-type or n-type of semiconductors. If the first conductivity type is p-type, the second conductivity type is n-type. On the contrary, if the first conductivity type is n-type, the second conductivity type is p-type.

In order to achieve the above object, an electrostatic protection device included in a semiconductor integrated circuit according to the present invention is configured so that a diffusion layer of the same conductivity type as that of a base is provided below the base.

Specifically, a semiconductor integrated circuit of the present invention includes: a semiconductor substrate of a first conductivity type; a first diffusion layer of a second conductivity type formed on the semiconductor substrate or in an upper part of the semiconductor substrate; a second diffusion layer of the first conductivity type formed in an upper part of the first diffusion layer, and serving as a base; a third diffusion layer of the second conductivity type formed in an upper part of the second diffusion layer, and serving as an emitter; a fourth diffusion layer of the second conductivity type formed in the upper part of the first diffusion layer so as to be separated from the second diffusion layer, and serving as a collector contact; and a fifth diffusion layer of the first conductivity type formed at least below the third diffusion layer so as to be separated from the second diffusion layer in a depth direction, and so as to have a lower end located below a lower end of the first diffusion layer. A sum of a shortest distance from the third diffusion layer to the fifth diffusion layer and a shorter one of a shortest distance from the fifth diffusion layer to the fourth diffusion layer and a shortest distance from the lower end of the first diffusion layer to the fourth diffusion layer is smaller than a shortest distance from the third diffusion layer to the fourth diffusion layer.

According to the semiconductor integrated circuit of the present invention, a vertical (the direction perpendicular to the substrate surface) current component can further be increased. Thus, a lateral (the direction parallel to the substrate surface) current component near the surface of the semiconductor substrate, which directly affects breakdown of the electrostatic protection device included in the semiconductor integrated circuit, can be reduced, whereby a breakdown current can be increased, and thus breakdown endurance can be increased. In the above configuration, since the fifth diffusion layer of the first conductivity type is provided in the region immediately below the emitter, the area of the electrostatic protection device is not increased. Moreover, the concentration in the base region in the bipolar operation is increased, and hFE is reduced, whereby a holding voltage can be increased. Thus, characteristics of the electrostatic protection device can further be improved.

In the semiconductor integrated circuit of the present invention, it is preferable that the fifth diffusion layer be also formed below the fourth diffusion layer, and not be in contact with the fourth diffusion layer.

In the semiconductor integrated circuit of the present invention, the fifth diffusion layer may be formed below the third diffusion layer and below the fourth diffusion layer, and these fifth diffusion layers may be separated from each other by the first diffusion layer.

The semiconductor integrated circuit of the present invention may further include an element isolation region formed around the first diffusion layer, and the fifth diffusion layer may be in contact with the element isolation region.

In the semiconductor integrated circuit of the present invention, it is preferable that the fourth diffusion layer include, below the collector contact, a region having a higher impurity concentration than the first diffusion layer.

In the semiconductor integrated circuit of the present invention, it is preferable that a sixth diffusion layer serving as a base contact be formed on an opposite lateral side of the third diffusion layer from the fourth diffusion layer in the upper part of the second diffusion layer so as to be separated from the third diffusion layer, and the sixth diffusion layer be of the first conductivity type, and have a higher impurity concentration than the second diffusion layer.

In the semiconductor integrated circuit of the present invention, it is preferable that the second diffusion layer and the third diffusion layer be electrically connected to a lowest potential, and the fourth diffusion layer be electrically connected to an input/output terminal or a power supply terminal, and an internal circuit.

In the semiconductor integrated circuit of the present invention, the first diffusion layer may be formed on the semiconductor substrate by epitaxial growth.

In the semiconductor integrated circuit of the present invention, it is preferable that an oxide film be formed between the second diffusion layer and the fourth diffusion layer.

In the semiconductor integrated circuit of the present invention, it is preferable that the third diffusion layer and the fourth diffusion layer have a higher impurity concentration than the first diffusion layer.

As described above, according to the semiconductor integrated circuit of the present invention, an electrostatic protection device having a high breakdown current and a high holding voltage, and having higher protection capability can be obtained without increasing the area.

DETAILED DESCRIPTION

Characteristics required for common electrostatic protection devices using a common base and common emitter bipolar transistor will be described with reference to FIG. 1.

Figure 1:
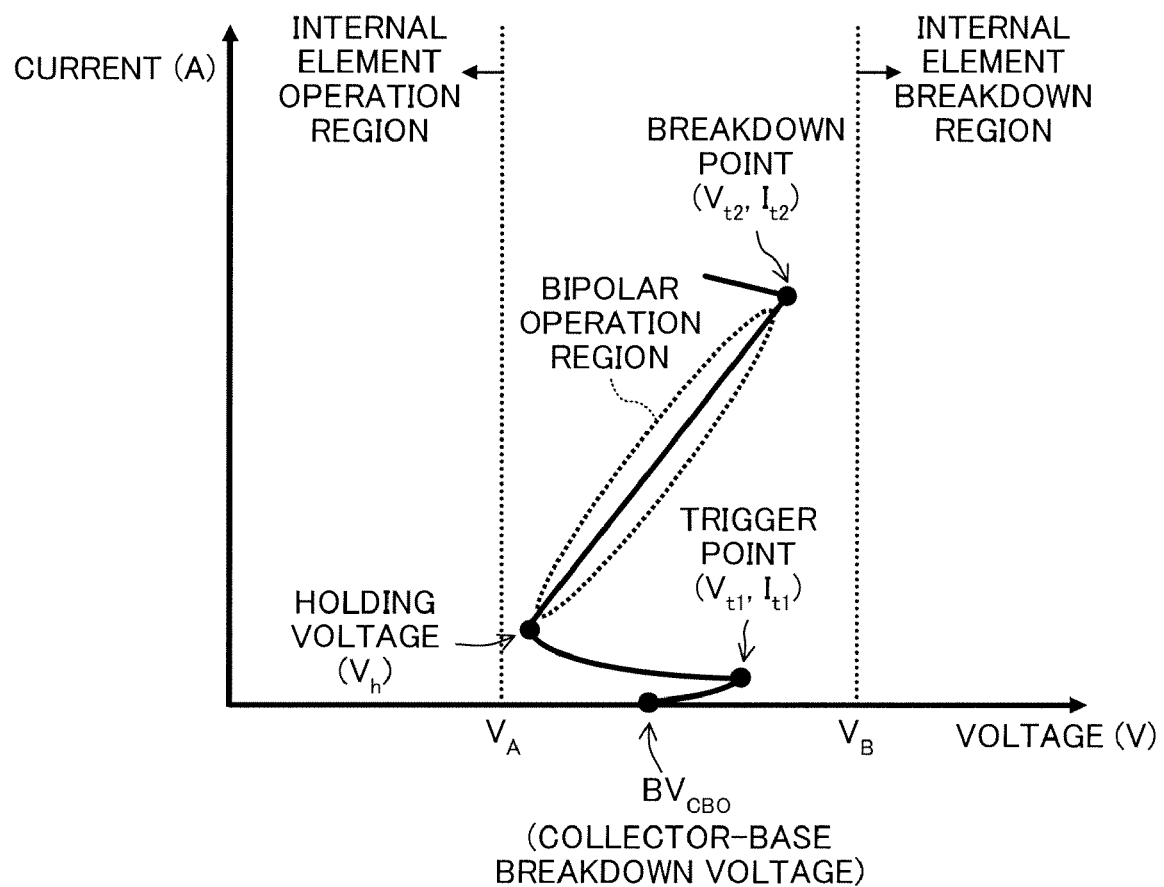
FIG. 1 is a graph showing voltage-current characteristics of common electrostatic protection devices formed by an npn transistor.

As shown in FIG. 1, when positive surge charge is applied to a collector, avalanche breakdown occurs in a region between the collector and a base, and in a curvature region of a base diffusion layer, and a current starts to flow (a collector-base breakdown voltage: $BV_{CBO}$). This current flows through a base resistor that is present in the current path to a base electrode, whereby the base potential increases, and the transistor starts a bipolar operation (a trigger point: a trigger voltage $V_{t1}$, a trigger current $I_{t1}$). When the bipolar operation is started, the collector potential decreases to a breakdown voltage (a collector-emitter breakdown voltage: a holding voltage $V_h$) that is dependent on the current gain (hFE) in the bipolar operation. Then, the voltage increases depending on the collector resistance, and thermal runaway is caused by heat generated within the transistor, resulting in breakdown (a breakdown point: a breakdown voltage $V_{t2}$, breakdown endurance $I_{t2}$). The electrostatic protection device operating in this manner needs to operate before the voltage increases to a voltage $V_B$ that breaks down an internal element in an internal circuit to be protected, and thus it is required that $V_{t1}$ be smaller than $V_B$ ($V_{t1} < V_B$). In order to prevent breakdown due to latch-up of products, the holding voltage $V_h$ should not be lower than the maximum value $V_A$ of the operating voltage of the internal element during operation of the electrostatic protection device. That is, "$V_h > V_A$" needs to be satisfied. In order to obtain high protection capability, electrostatic protection devices are desired which have as high breakdown endurance $I_{t2}$ as possible within the range of the above voltage conditions.

(First Example Embodiment)

An electrostatic protection device included in a semiconductor integrated circuit of a first example embodiment will be described with reference to FIGS. 2-3. A LOCOS film 21 and an interlayer insulating film 22, which will be described later, are omitted in FIG. 2. The LOCOS film 21 and the interlayer insulating film 22 are also omitted in FIGS. 8, 10, and 12 that will be described later.

Figure 2:
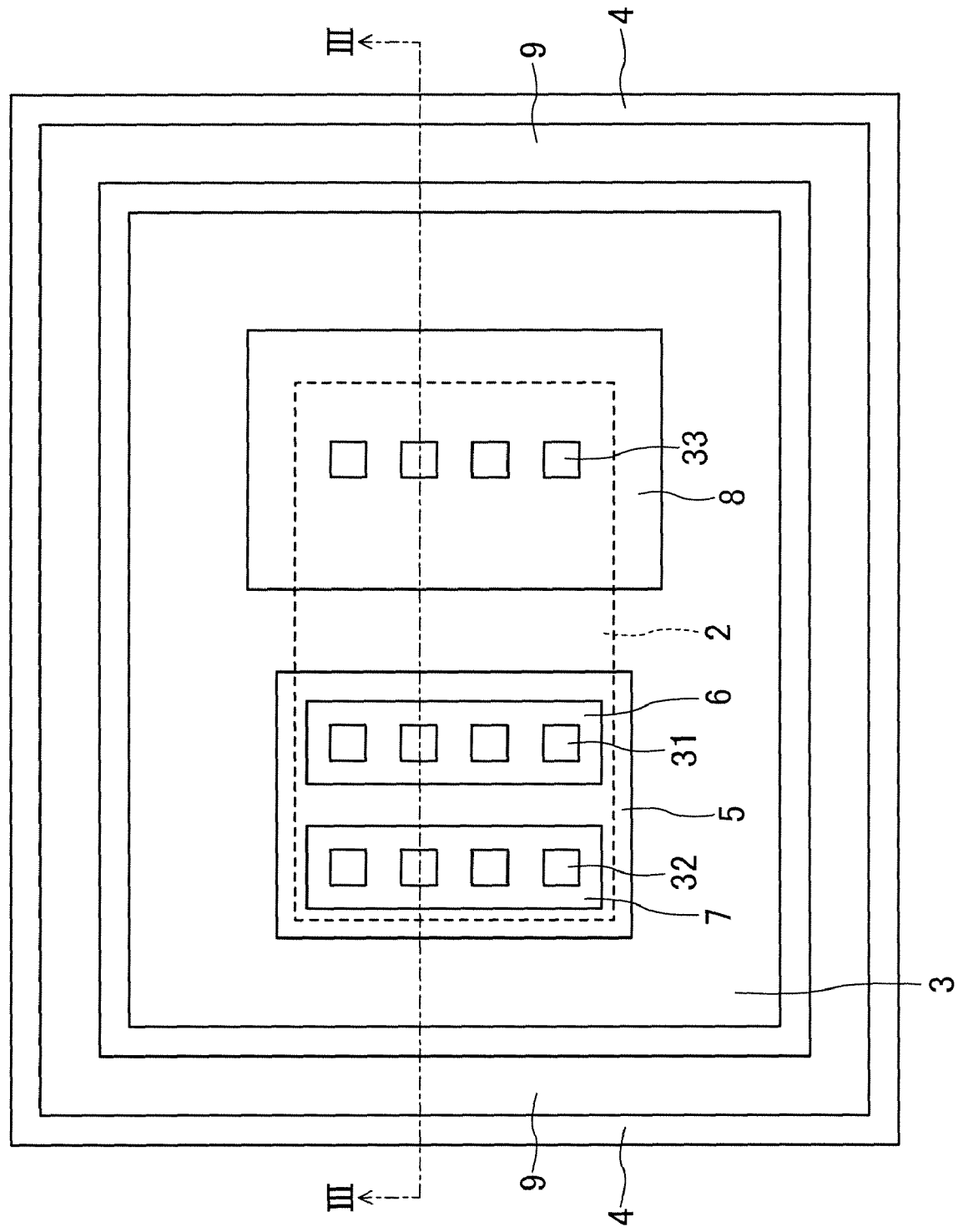
FIG. 2 is a plan view of an electrostatic protection device of a first example embodiment.
Figure 3:
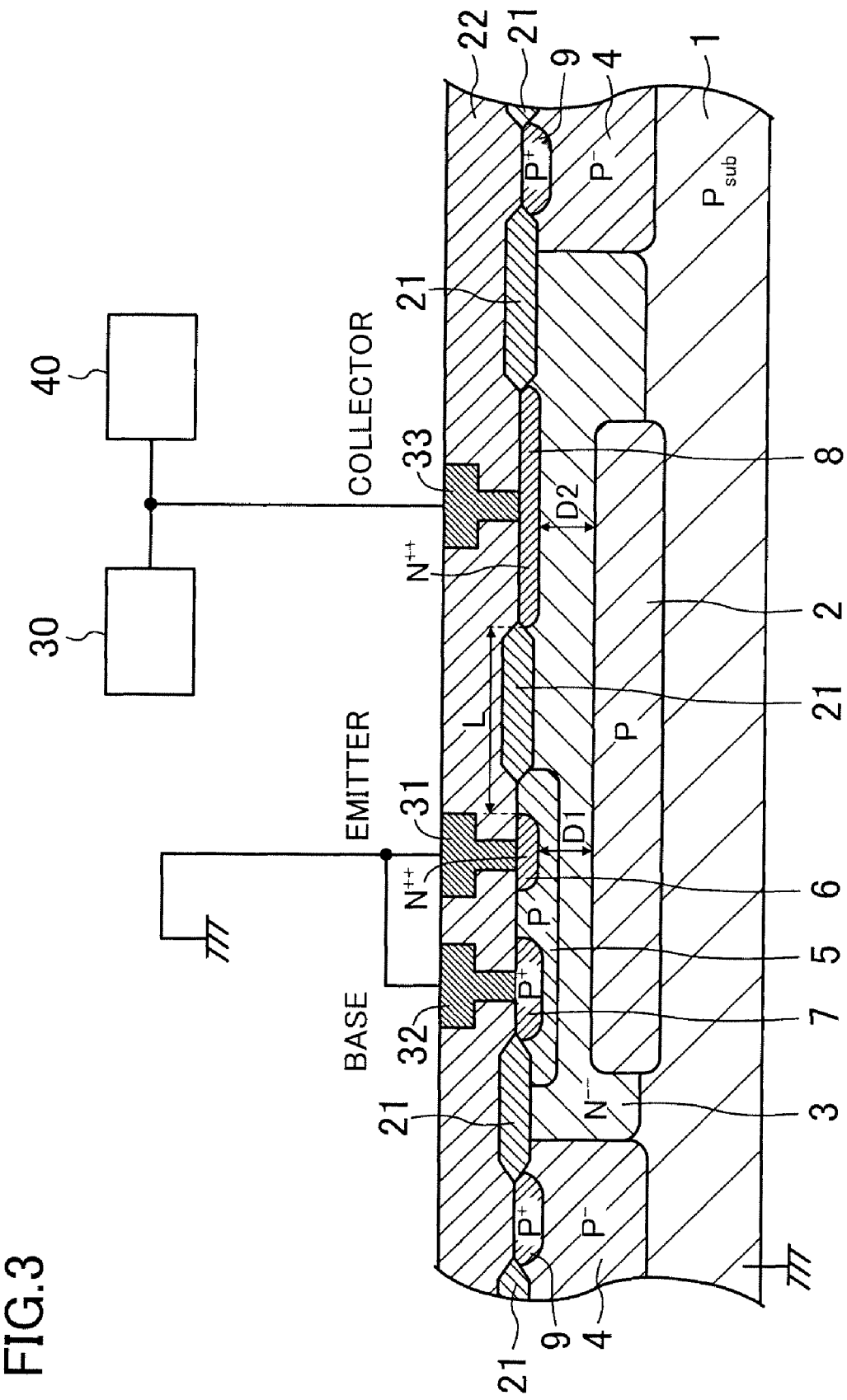
FIG. 3 is a cross-sectional view of the electrostatic protection device of the first example embodiment taken along line in FIG. 2.

As shown in FIGS. 2-3, an n-type low concentration diffusion layer 3 as a first diffusion layer is formed in the upper part of a p-type low concentration semiconductor substrate 1 made of, e.g., silicon, and a base p-type diffusion layer 5 as a second diffusion layer is formed in the upper part of the n-type low concentration diffusion layer 3. An emitter n-type high concentration diffusion layer 6 as a third diffusion layer is formed in the upper part of the base p-type diffusion layer 5. A collector contact n-type high concentration diffusion layer 8 as a fourth diffusion layer is formed in a region that is laterally separated from the base p-type diffusion layer 5 by a predetermined distance in the upper part of the n-type low concentration diffusion layer 3. An embedded p-type diffusion layer 2 as a fifth diffusion layer is formed so as to extend from a region below the emitter n-type high concentration diffusion layer 6 to a region below the collector contact n-type high concentration diffusion layer 8 in the n-type low concentration diffusion layer 3, and so as not to contact the base p-type diffusion layer 5 in the depth direction. The embedded p-type diffusion layer 2 is formed so that its lower end is located below the lower end of the n-type low concentration diffusion layer 3, that is, so that the lower end of the embedded p-type diffusion layer 2 contacts the p-type low concentration semiconductor substrate 1. A base contact p-type high concentration diffusion layer 7 as a sixth diffusion layer is formed in a region separated from the emitter n-type high concentration diffusion layer 6 in the upper part of the base p-type diffusion layer 5. A LOCOS film 21 is formed between the base p-type diffusion layer 5 and the collector contact n-type high concentration diffusion layer 8 by a local oxidation of silicon (LOCOS) method. A p-type diffusion layer 4 is formed around the n-type low concentration diffusion layer 3, a p-type high concentration diffusion layer 9 is formed in the upper part of the p-type diffusion layer 4, and the p-type diffusion layer 4 and the p-type high concentration diffusion layer 9 form a p-type junction isolation layer. The above diffusion layers are formed by an ion implantation method using n-type impurities or p-type impurities, etc. An emitter electrode 31 forms an ohmic connection to the emitter n-type high concentration diffusion layer 6, a base electrode 32 forms an ohmic connection to the base contact p-type high concentration diffusion layer 7, and a collector electrode 33 forms an ohmic connection to the collector contact n-type high concentration diffusion layer 8. An interlayer insulating film 22 is formed over the p-type low concentration semiconductor substrate 1 so as to fill the gaps between the emitter electrode 31, the base electrode 32, and the collector electrode 33. The base electrode 32 and the emitter electrode 31 are short-circuited together via an aluminum interconnect, etc. or via a resistor, and are connected to the lowest potential such as the ground (GND). The collector electrode 33 is connected via an aluminum interconnect, etc. to an I/O pad (PAD) 30 and an internal circuit 40 that are formed on a substrate of the semiconductor integrated circuit.

In the electrostatic protection device of the present embodiment, the sum of the distance D1 from the emitter n-type high concentration diffusion layer 6 to the embedded p-type diffusion layer 2 and the distance D2 from the embedded p-type diffusion layer 2 to the collector contact n-type high concentration diffusion layer 8 is smaller than the distance L from the end on the collector side of the emitter n-type high concentration diffusion layer 6 to the end on the base side of the collector contact n-type high concentration diffusion layer 8. The distance D1 is the shortest distance from the emitter n-type high concentration diffusion layer 6 to the embedded p-type diffusion layer 2 in any cross section of the electrostatic protection device of the present embodiment. Similarly, the distance D2 is the shortest distance from the embedded p-type diffusion layer 2 to the collector contact n-type high concentration diffusion layer 8 in any cross section of the electrostatic protection device of the present embodiment. The distance L is the shortest distance from the end on the collector side of the emitter n-type high concentration diffusion layer 6 to the end on the base side of the collector contact n-type high concentration diffusion layer 8 in any cross section of the electrostatic protection device of the present embodiment. As used herein, the "shortest distance" is the length of the shortest straight line or curve of the straight lines or curves connecting any points in each region.

The same diffusion layer can be used as the emitter n-type high concentration diffusion layer 6 and the collector contact n-type high concentration diffusion layer 8, and the same diffusion layer can be used as the base contact p-type high concentration diffusion layer 7 and the p-type high concentration diffusion layer 9. Since the n-type low concentration diffusion layer 3 can be any layer having a low concentration, the n-type low concentration diffusion layer 3 may be formed by an epitaxial growth method using a uniform concentration material, rather than by impurity injection from the surface. In this case as well, the electrostatic protecting device of the present embodiment operates similarly. The embedded p-type diffusion layer 2 can be formed at a desired depth from the surface of the semiconductor substrate 1 by a high energy implantation method. In the case where the n-type low concentration diffusion layer 3 is formed by an epitaxial growth method, the embedded p-type diffusion layer 2 can be easily formed by diffusing impurities from the surface side of the semiconductor substrate 1 before performing the epitaxial growth method.

The impurity concentration profiles of the diffusion layers, etc. in the electrostatic protection device of the present embodiment will be described below.

The p-type low concentration semiconductor substrate 1 has an impurity concentration of about $1.0 \times 10^{15}/cm^3$, the n-type low concentration diffusion layer 3 has an impurity concentration of about $5.0 \times 10^{14}/cm^3$ to about $3.0 \times 10^{16}/cm^3$, and the base p-type diffusion layer 5 has an impurity concentration of about $1.0 \times 10^{17}/cm^3$ to about $2.0 \times 10^{18}/cm^3$. The emitter n-type high concentration diffusion layer 6 and the collector contact n-type high concentration diffusion layer 8 have an impurity concentration of about $5.0 \times 10^{18}/cm^3$ to about $5.0 \times 10^{20}/cm^3$. The base contact p-type high concentration diffusion layer 7 has an impurity concentration of about $1.0 \times 10^{19}/cm^3$ to about $5.0 \times 10^{20}/cm^3$. The p-type junction isolation layer formed by the p-type diffusion layer 4 and the p-type high concentration diffusion layer 9 may have any impurity concentration equal to or higher than about $1.0 \times 10^{16}/cm^3$, and the embedded p-type diffusion layer 2 has an impurity concentration of about $2.0 \times 10^{15}/cm^3$ to about $1.0 \times 10^{17}/cm^3$.

The operation of the electrostatic protection device included in the semiconductor integrated circuit of the first example embodiment will be described below with reference to FIGS. 4-7.

Figure 4:
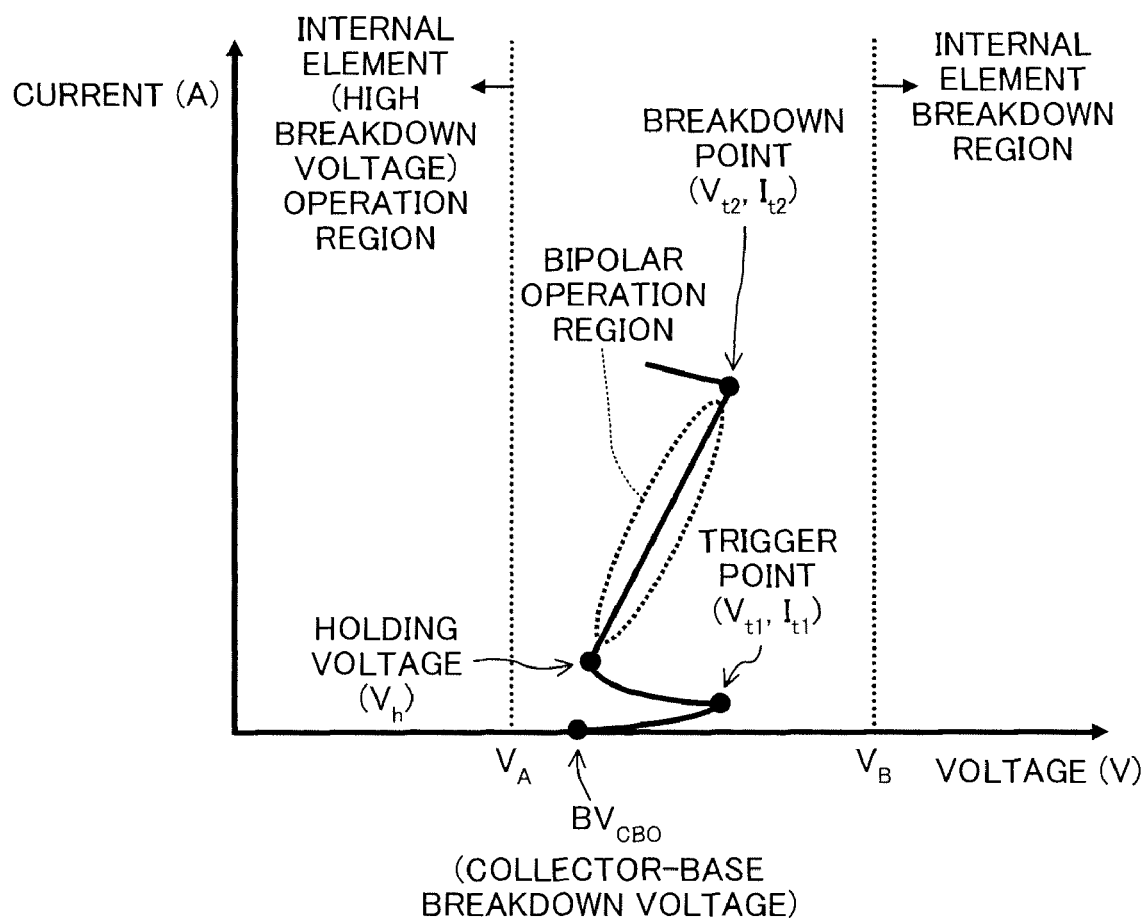
FIG. 4 is a graph showing voltage-current characteristics of the electrostatic protection device of the first example embodiment.
Figure 5:
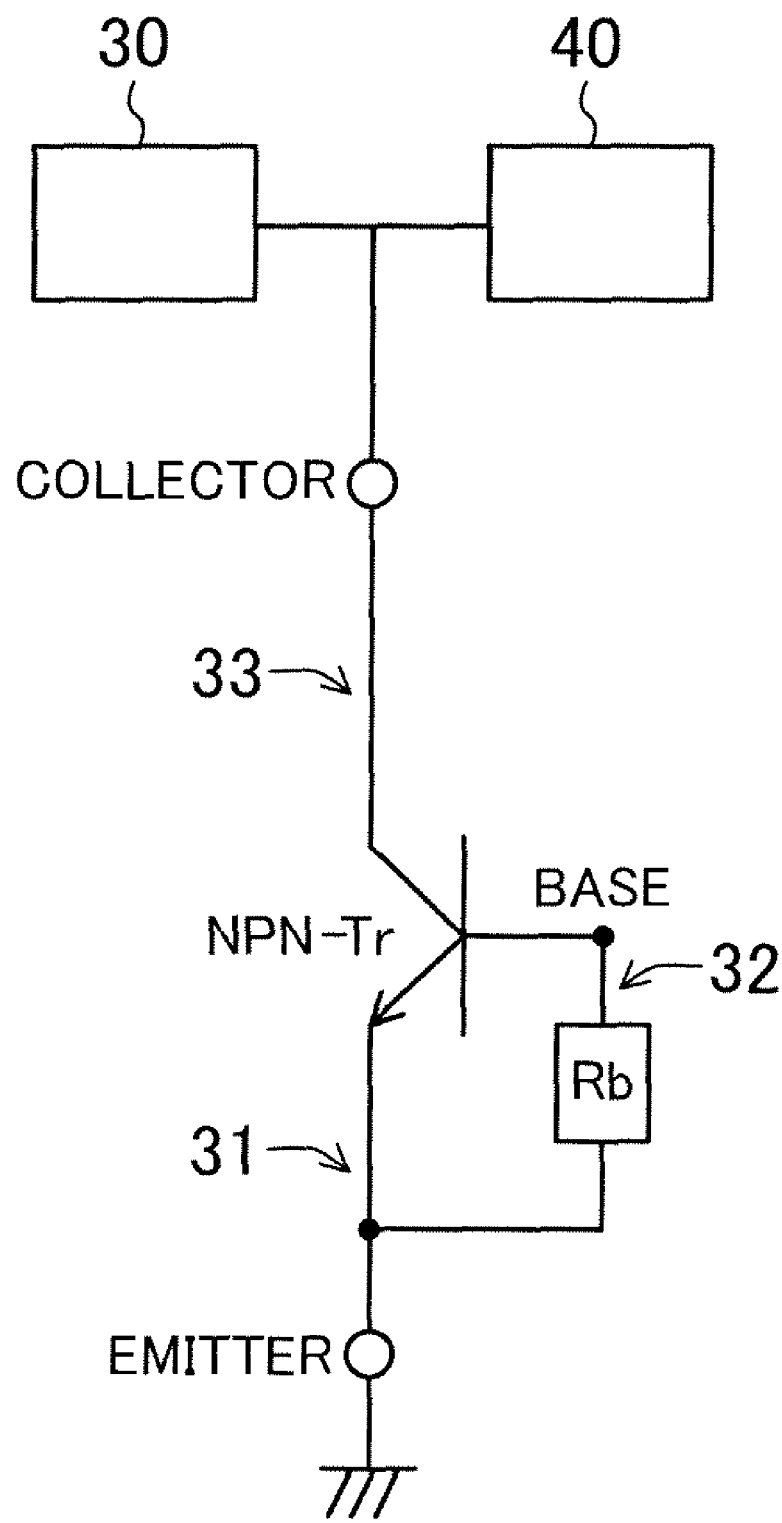
FIG. 5 is an equivalent circuit diagram of the electrostatic protection device of the first example embodiment.
Figure 6:
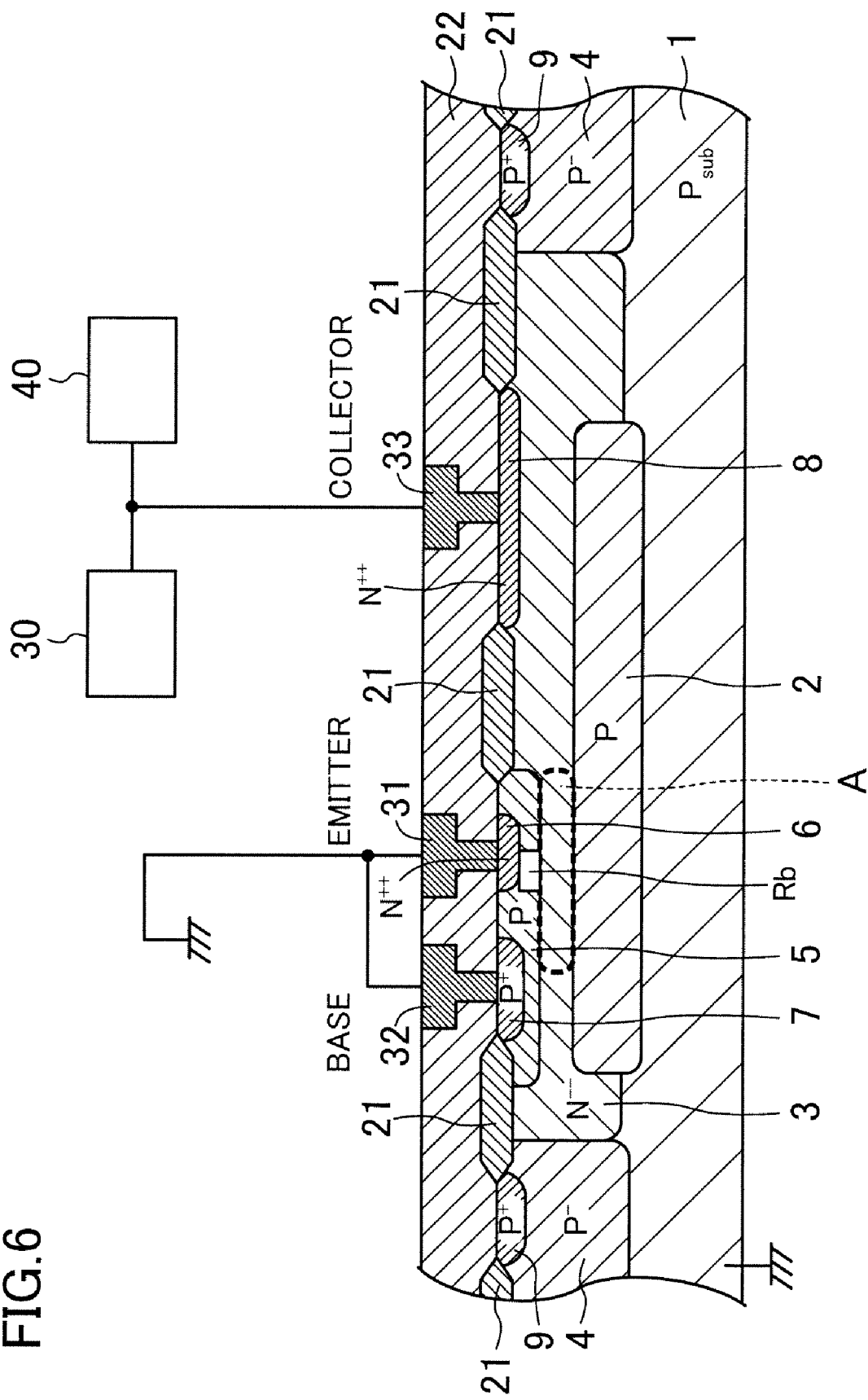
FIG. 6 is a cross-sectional view illustrating the state when the electrostatic protection device of the first example embodiment performs a bipolar operation.

As shown in FIGS. 4-5, when positive surge charge is applied from the I/O PAD 30 to the collector electrode 33, avalanche breakdown occurs in a region between the collector and the base, and in a curvature region on the collector side of the base p-type diffusion layer 5 (a collector-base breakdown voltage: $BV_{CBO}$). After the breakdown, a current produced by the breakdown increases due to the surge charge, and the current flows through a resistor that is present in the current path to the base electrode 32, namely a region Rb shown in FIGS. 5-6. Thus, the base potential increases to the turn-on voltage of the npn transistor, and the npn transistor starts a bipolar operation (a trigger point: a trigger voltage $V_{t1}$, a trigger current $I_{t1}$). When the npn transistor starts the bipolar operation, and the current increases due to the surge charge, the number of electrons injected from the emitter n-type high concentration diffusion layer 6 becomes excessive as a region located below the emitter n-type high concentration diffusion layer 6 in the n-type low concentration diffusion layer 3, namely a region A in FIG. 6, has a low impurity concentration. In order to neutralize the excess electrons, holes are injected from the base p-type diffusion layer 5, whereby the region A functions like a base. That is, a phenomenon called "base conductivity modulation" or the "Kirk effect" occurs. At this time, the region A in the n-type low concentration diffusion layer 3 is not an n-type layer but a neutral region, and the resistance component decreases, whereby the collector potential decreases. As a result, the collector potential decreases from the trigger voltage $V_{t1}$ to a holding voltage $V_h$ between the collector and the emitter, which is dependent on hFE of the npn transistor at this time. However, since all of the region located below the emitter n-type high concentration diffusion layer 6 in the base p-type diffusion layer 5, the region A, and the embedded p-type diffusion layer 2 function as a base in the bipolar operation, the base width is increased, and hFE is reduced at this time, whereby a high holding voltage $V_h$ is maintained.

Figure 7:
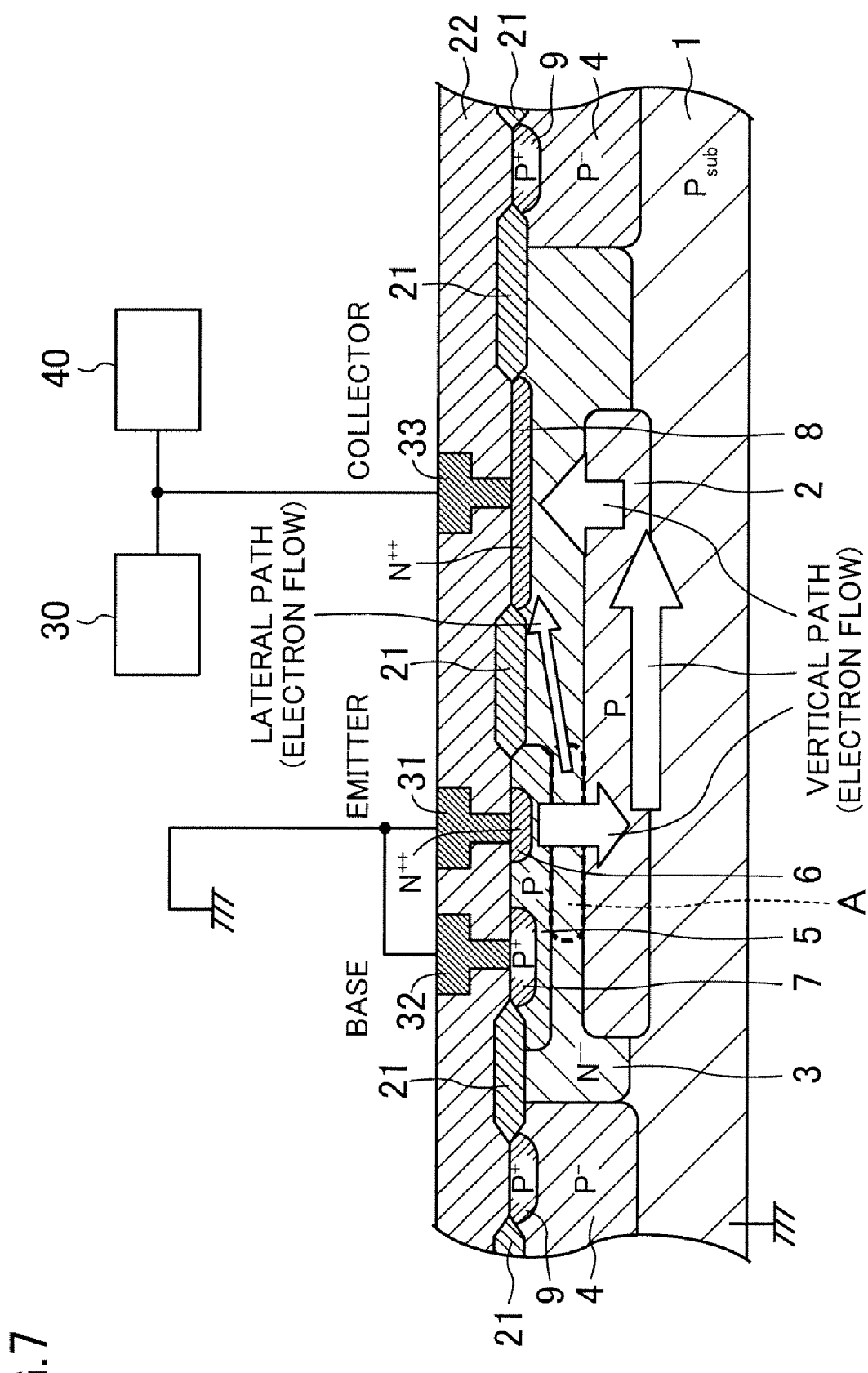
FIG. 7 is a cross-sectional view illustrating a current path after the electrostatic protection device of the first example embodiment has started the bipolar operation.

As shown in FIG. 7, if the current further increases thereafter, most of the current flows in the vertical direction as the distance in the vertical direction (the direction perpendicular to the substrate surface), namely the sum of the distances D1, D2, is shorter than the distance L in the lateral direction (the direction parallel to the substrate surface) as described above, and thus the vertical resistance component is lower than the lateral resistance component. Accordingly, the lateral current component near the surface of the n-type low concentration diffusion layer 3 decreases, whereby current concentration is avoided. As a result, a breakdown current is increased, and breakdown endurance $I_{t2}$ is increased.

According to the electrostatic protection device included in the semiconductor integrated circuit of the first example embodiment, since most of the current flows in the vertical direction, the current flowing in the lateral direction near the surface is reduced, and current concentration is avoided. Thus, the breakdown endurance can be increased.

In the electrostatic protection device of the first example embodiment, since the embedded p-type diffusion layer 2 is provided in the region below the emitter n-type high concentration diffusion layer 6, the breakdown endurance can be increased without increasing the area of the device. Moreover, since the base width is increased in the bipolar operation, a high holding voltage $V_h$ can be maintained, and thus the electrostatic protection device of the first example embodiment is also advantageous in that it can be used for protection of high breakdown voltage elements.

Figure 8:
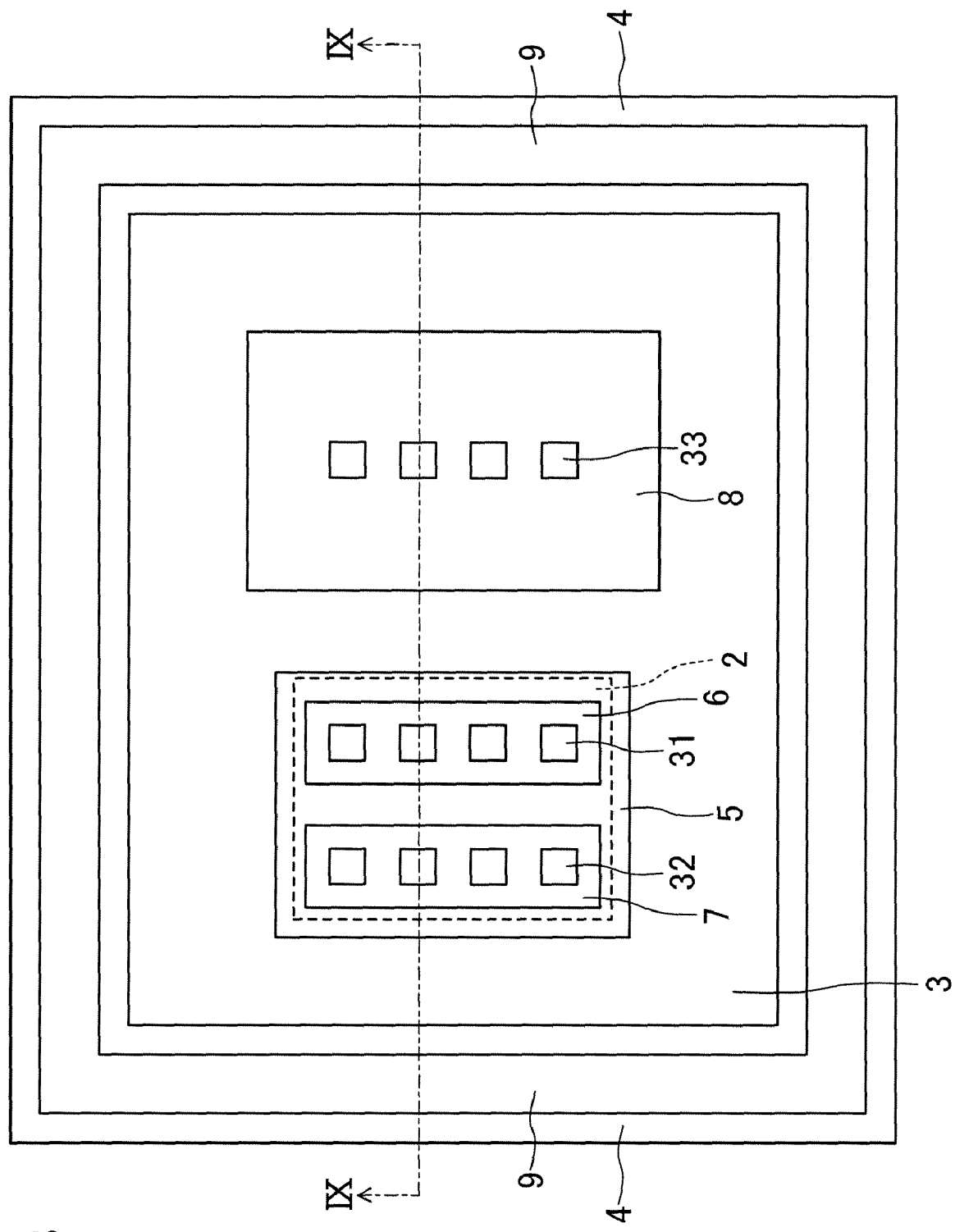
FIG. 8 is a plan view of an electrostatic protection device of a first modification of the first example embodiment.
Figure 9:
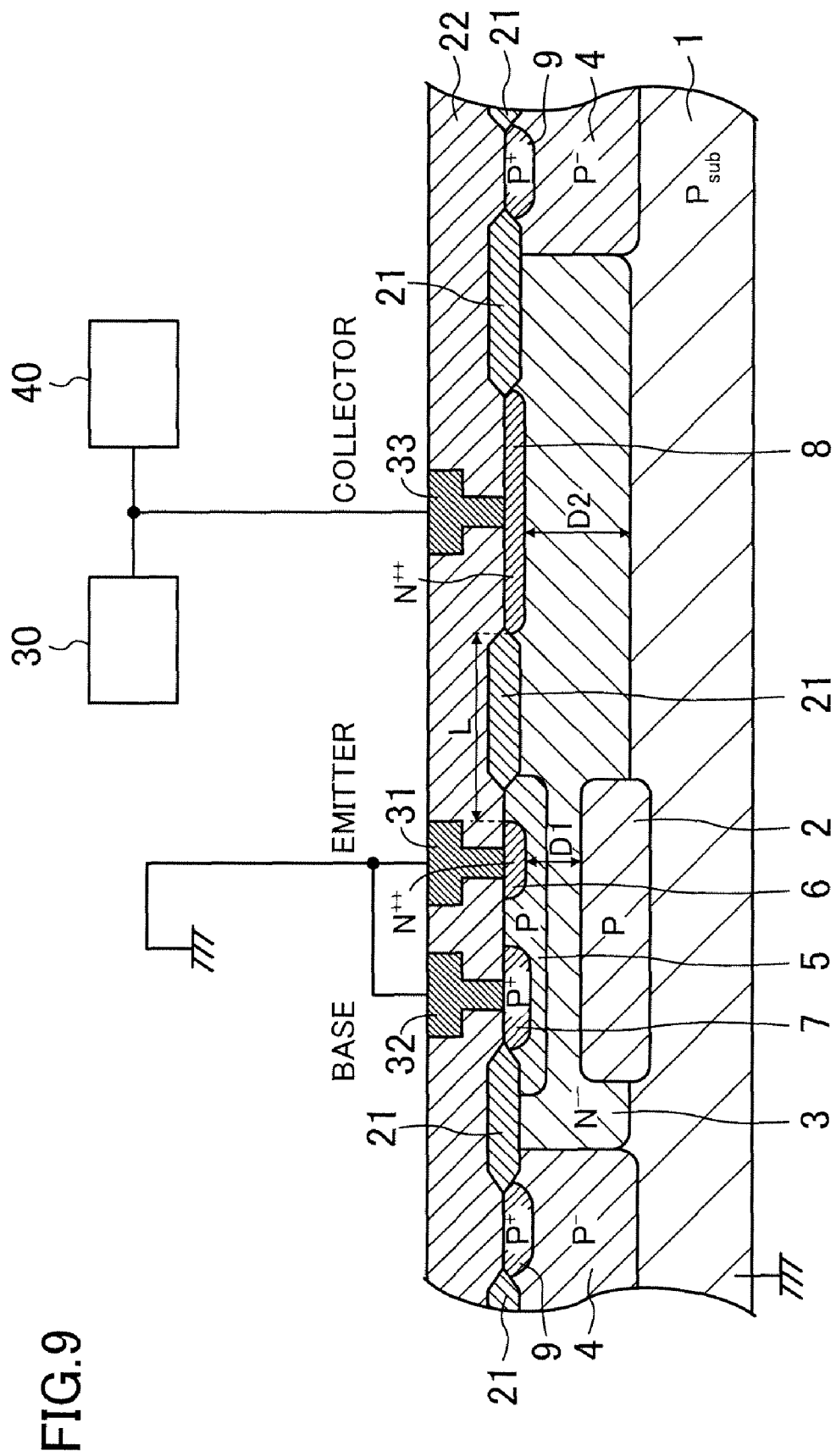
FIG. 9 is a cross-sectional view of the electrostatic protection device of the first modification of the first example embodiment taken along line IX-IX in FIG. 8.

Note that as shown in FIGS. 8-9, the embedded p-type diffusion layer 2 may be formed only in a region below the base p-type diffusion layer 5 without being formed in the region below the collector contact n-type high concentration diffusion layer 8 in the n-type low concentration diffusion layer 3. In this case, the distance D2 is the shortest distance from the lower end of the n-type low concentration diffusion layer 3 to the collector contact n-type high concentration diffusion layer 8 in any cross section of the electrostatic protection device of the first example embodiment, and the sum of the distances D1, D2 is smaller than the distance L as in the first example embodiment.

Figure 10:
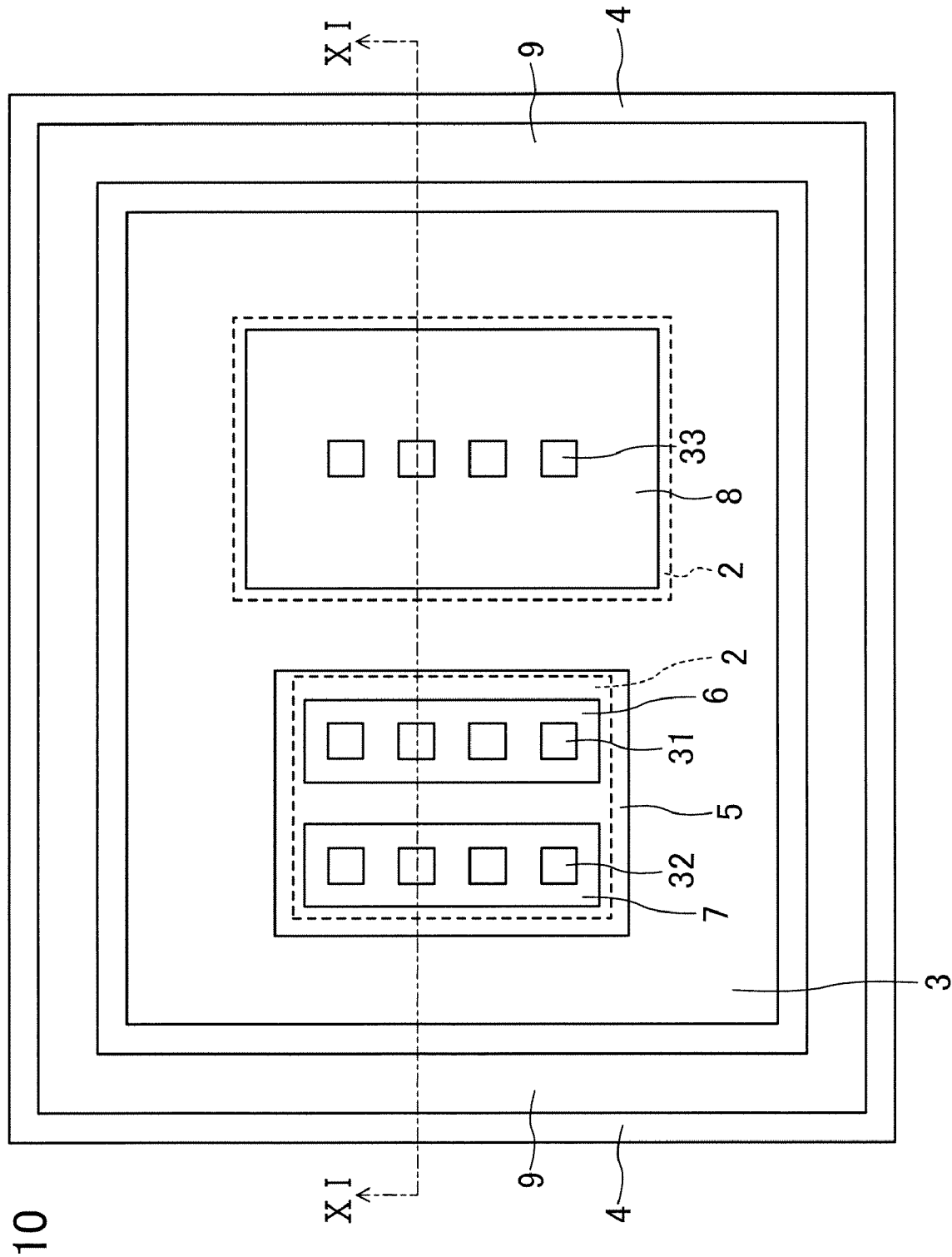
FIG. 10 is a plan view of an electrostatic protection device of a second modification of the first example embodiment.
Figure 11:
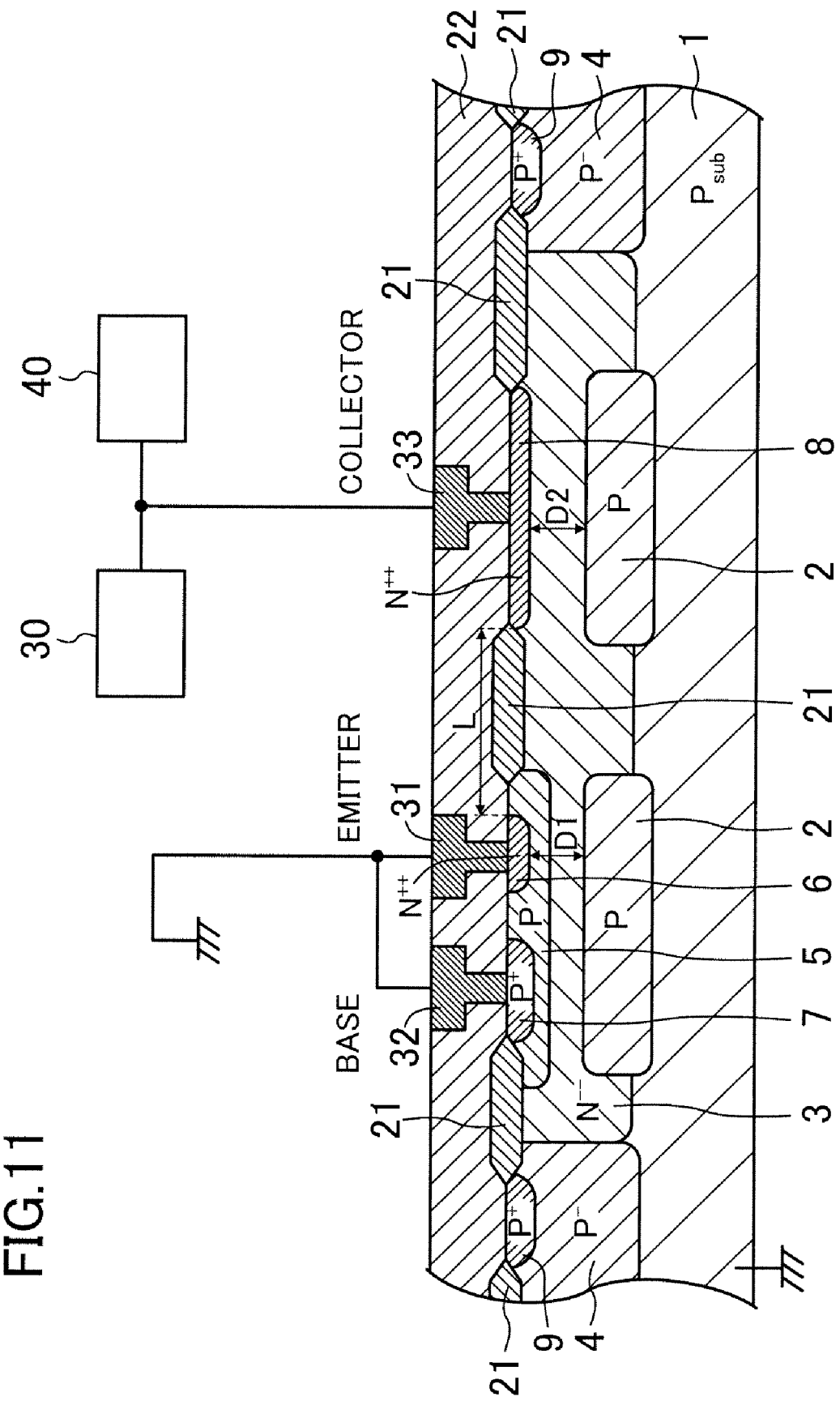
FIG. 11 is a cross-sectional view of the electrostatic protection device of the second modification of the first example embodiment taken along line XI-XI in FIG. 10.

As shown in FIGS. 10-11, the embedded p-type diffusion layer 2 may be formed in two regions, namely in the regions below the base p-type diffusion layer 5 and below the collector contact n-type high concentration diffusion layer 8 in the n-type low concentration diffusion layer 3, and these embedded p-type diffusion layers 2 may be separated from each other by the n-type low concentration diffusion layer 3. In this case, such a region of the p-type low concentration semiconductor substrate 1 that extends from a region below the emitter n-type high concentration diffusion layer 6 to a region below the collector contact n-type high concentration diffusion layer 8, and that has no embedded p-type diffusion layer 2 formed therein also functions as a base in the bipolar operation.

Figure 12:
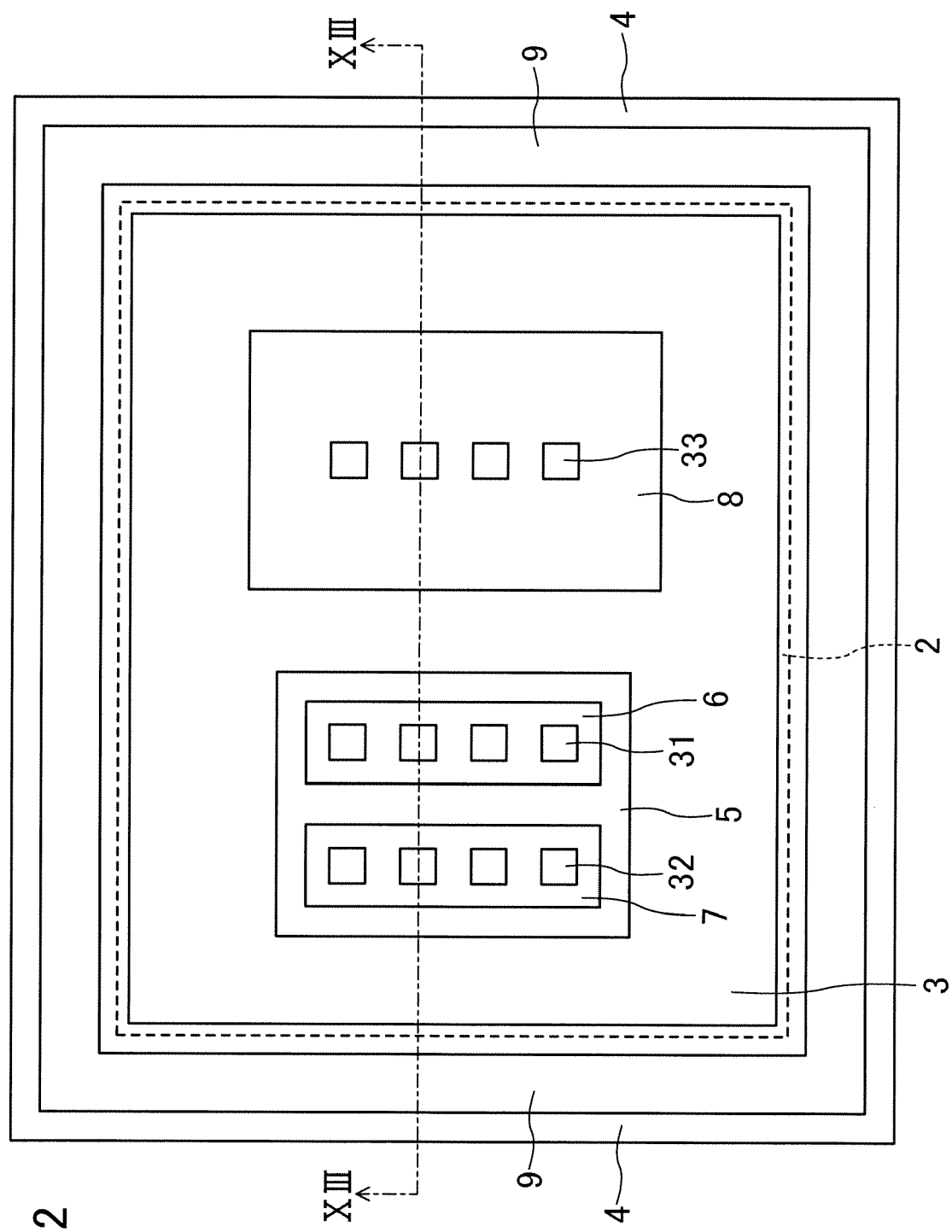
FIG. 12 is a plan view of an electrostatic protection device of a third modification of the first example embodiment.
Figure 13:
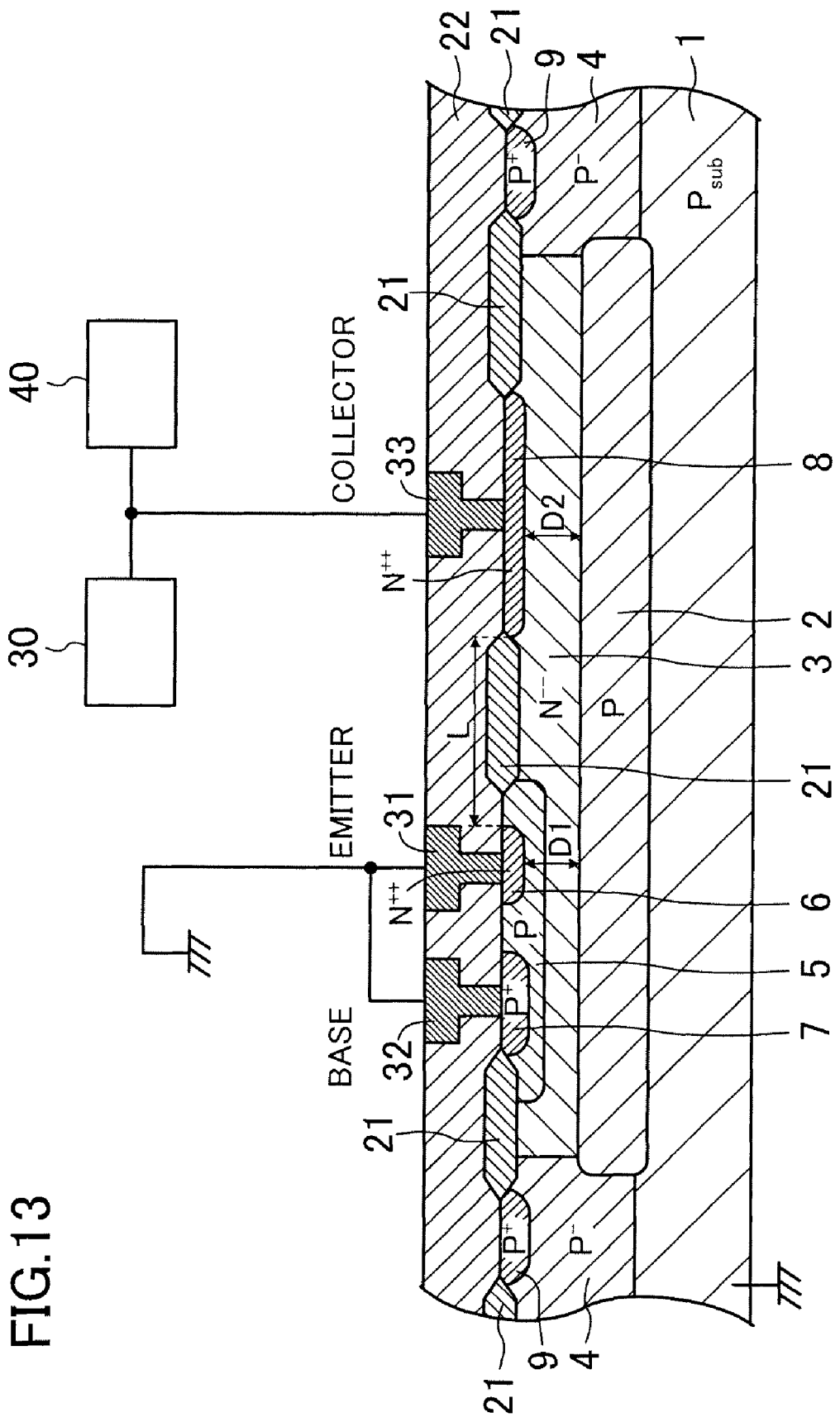
FIG. 13 is a cross-sectional view of the electrostatic protection device of the third modification of the first example embodiment taken along line XIII-XIII in FIG. 12.

As shown in FIGS. 12-13, similar advantages are obtained even if the embedded p-type diffusion layer 2 is formed so as to extend from the region below the base p-type diffusion layer 5 to the region below the collector contact n-type high concentration diffusion layer 8, and to extend further to contact the p-type diffusion layer 4. That is, providing the embedded p-type diffusion layer 2 in the region that facilitates the vertical current flow rather than the lateral current flow can reduce current concentration in the surface region of the n-type low concentration diffusion layer 3, whereby the breakdown endurance $I_{t2}$ can be increased.

With the electrostatic protection devices according to the modifications of the first example embodiment as well, the breakdown endurance and the holding voltage can be increased without increasing the area of the device, as in the first example embodiment.

(Second Example Embodiment)

An electrostatic protection device included in a semiconductor integrated circuit of a second example embodiment will be described with reference to FIGS. 14-15. In the second example embodiment, the same members as those of the first example embodiment are denoted by the same reference characters, and description thereof will be omitted. Only those parts different from the first example embodiment will be described below. As in the first example embodiment, the LOCOS film 21 and the interlayer insulating film 22 are omitted in FIG. 14. The LOCOS film 21 and the interlayer insulating film 22 are also omitted in FIG. 19 that will be described later.

Figure 14:
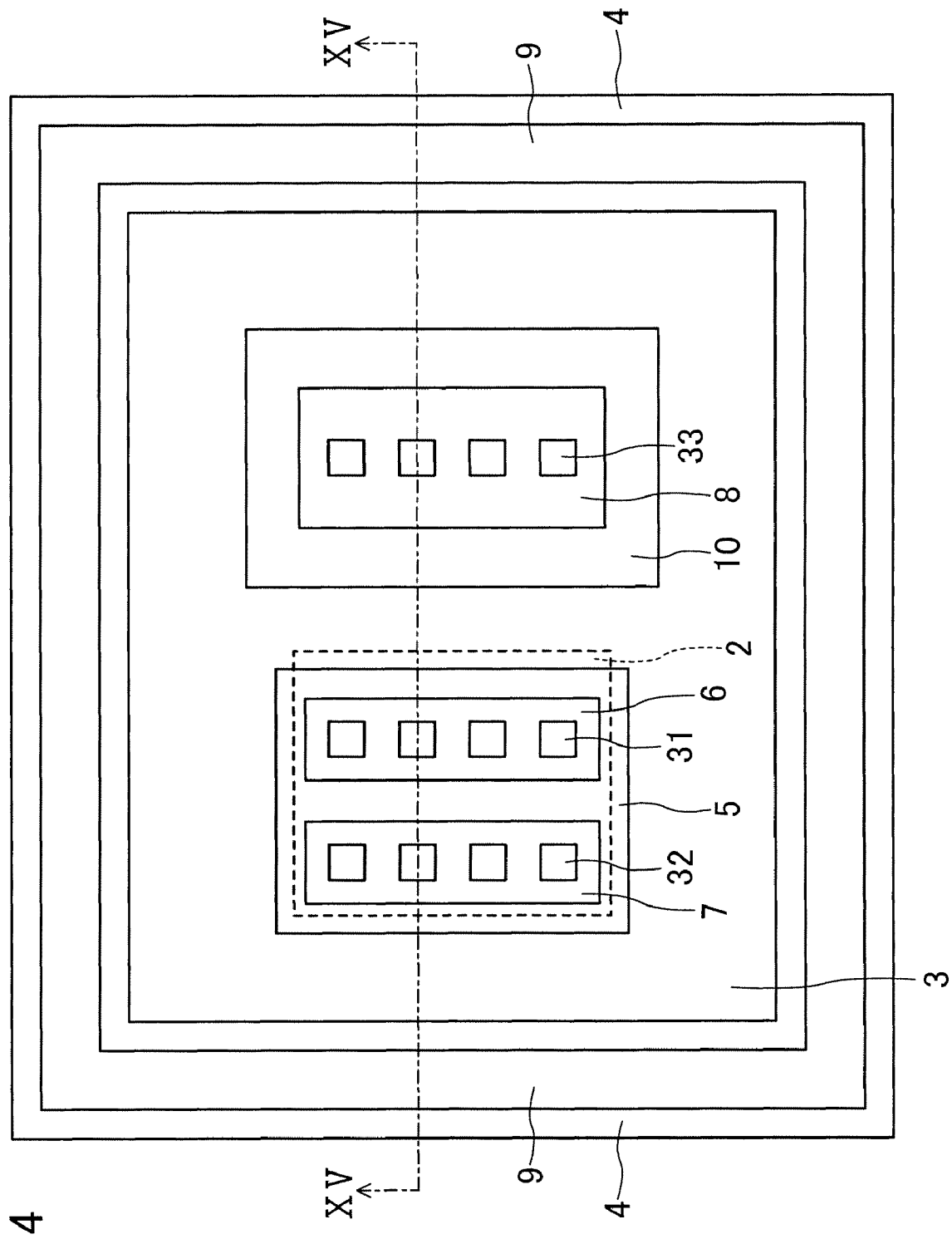
FIG. 14 is a plan view of an electrostatic protection device of a second example embodiment.
Figure 15:
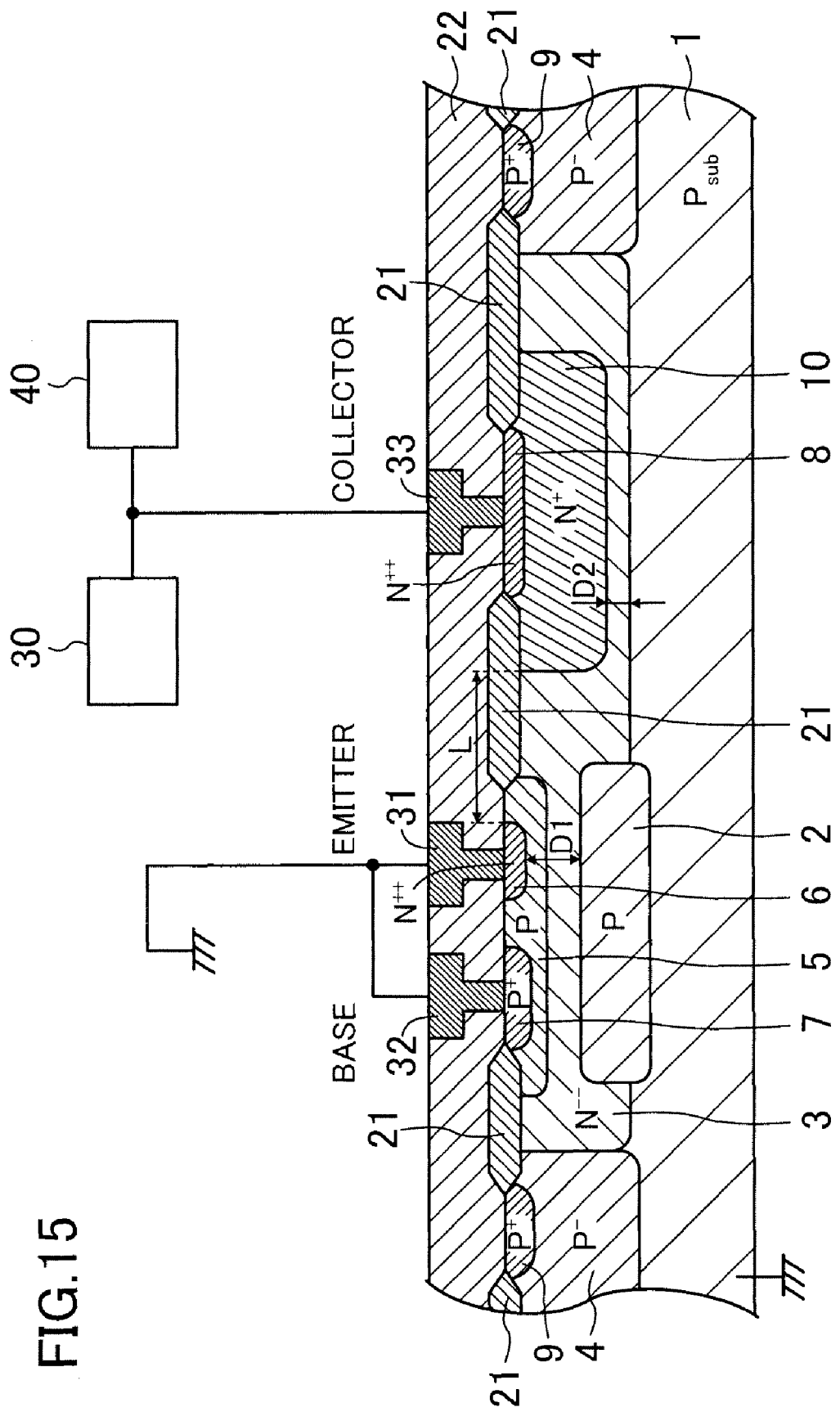
FIG. 15 is a cross-sectional view of the electrostatic protection device of the second example embodiment taken along line XV-XV in FIG. 14.

As shown in FIGS. 14-15, in the second example embodiment, an n-type high concentration sink layer 10 as a part of a fourth diffusion layer is formed in a region below a collector contact n-type high concentration diffusion layer 8 and a surrounding region thereof in the upper part of an n-type low concentration diffusion layer 3. The n-type high concentration sink layer 10 has a greater depth than a base p-type diffusion layer 5. The n-type high concentration sink layer 10 is formed so as to be separated from an embedded p-type diffusion layer 2 by a distance corresponding to at least an avalanche breakdown voltage between the collector and the base.

In the electrostatic protection device of the second example embodiment, the distance in the vertical direction, namely the sum of the distance D1 from an emitter n-type high concentration diffusion layer 6 to the embedded p-type diffusion layer 2 and the distance D2 from the lower end of the n-type low concentration diffusion layer 3 to the n-type high concentration sink layer 10, is shorter than the distance L in the lateral direction from the end on the collector side of the emitter n-type high concentration diffusion layer 6 to the end on the base side of the n-type high concentration sink layer 10. Since the n-type high concentration sink layer 10 has a greater depth than the base p-type diffusion layer 5, the distance D2 is shorter than in the first example embodiment. The n-type high concentration sink layer 10 is a common diffusion layer that is used to reduce the collector resistance of an npn transistor.

The impurity concentration profile of the n-type high concentration sink layer 10 is about $1.0 \times 10^{18}/cm^3$ to about $1.0 \times 10^{20}/cm^3$, and this impurity concentration is such a concentration that the n-type high concentration sink layer 10 is not brought into a neutral state even if a large current flows therein.

Figure 16:
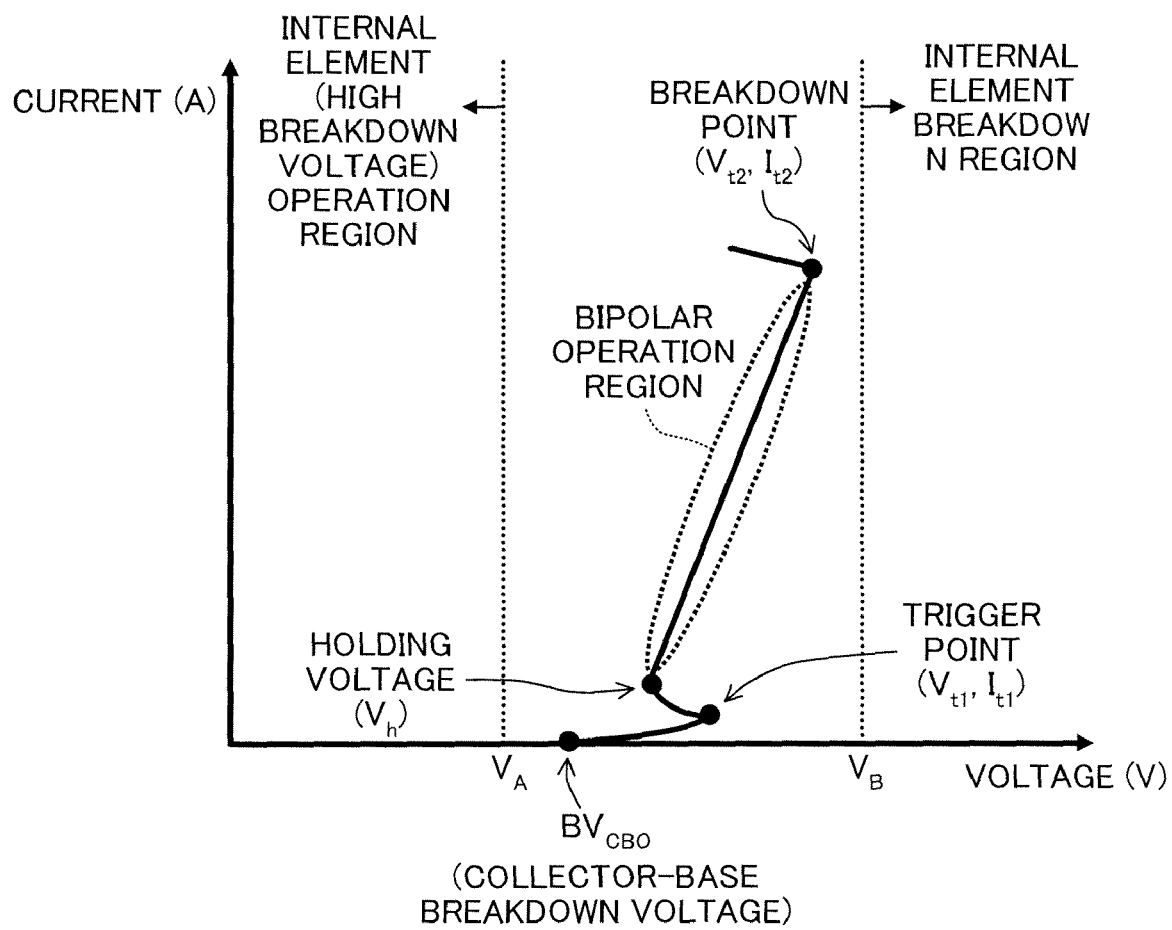
FIG. 16 is a graph showing voltage-current characteristics of the electrostatic protection device of the second example embodiment.
Figure 17:
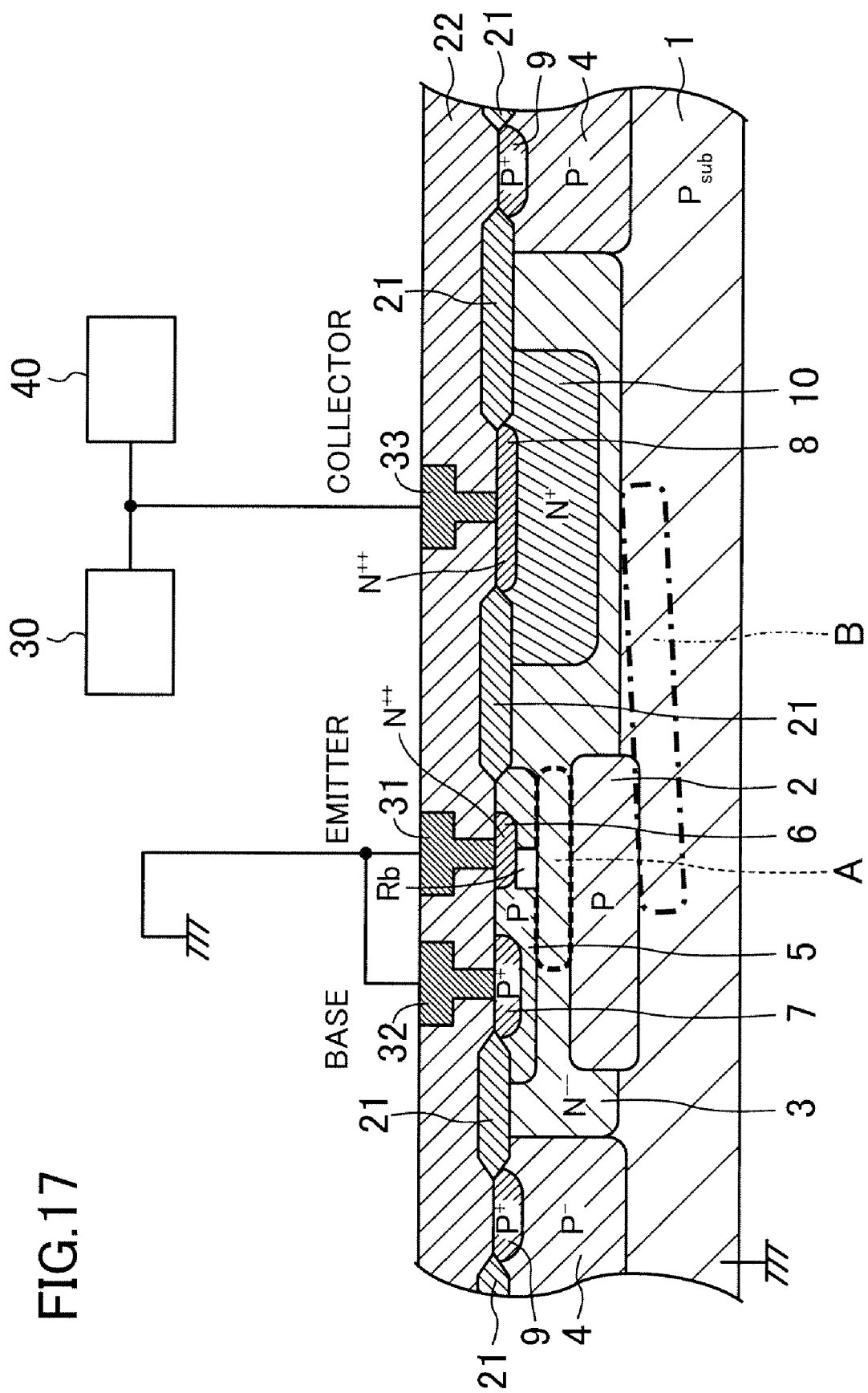
FIG. 17 is a cross-sectional view illustrating the state when the electrostatic protection device of the second example embodiment performs a bipolar operation.

The operation of the electrostatic protection device included in the semiconductor integrated circuit of the second example embodiment will be described with reference to FIGS. 16-18.

The electrostatic protection device of the second example embodiment operates in the same manner as that in the first example embodiment until the npn transistor starts a bipolar operation (a trigger point: a trigger voltage $V_{t1}$, a trigger current $I_{t1}$) after positive surge charge is applied from the collector electrode 33. When the npn transistor starts the bipolar operation, and a current increases due to the surge charge, the number of electrons injected from the emitter n-type high concentration diffusion layer 6 becomes excessive as a region located below the emitter n-type high concentration diffusion layer 6 in the n-type low concentration diffusion layer 3, namely a region A in FIG. 17, has a low impurity concentration. In order to neutralize the excess electrons, holes are injected from the base p-type diffusion layer 5, whereby the region A functions like a base. At this time, the region A in the n-type low concentration diffusion layer 3 is not an n-type layer but a neutral region, and the resistance component decreases, whereby the collector potential decreases. As a result, the collector potential decreases from the trigger voltage $V_{t1}$ to a holding voltage $V_h$ between the collector and the emitter, which is dependent on hFE of the npn transistor at this time. In the second example embodiment, all of the region located below the emitter n-type high concentration diffusion layer 6 in the base p-type diffusion layer 5, the region A, the embedded p-type diffusion layer 2, and a region extending from a region below the embedded p-type diffusion layer 2 to a region below the n-type high concentration sink layer 10 in the p-type low concentration semiconductor substrate 1, namely a region B in FIG. 17, function as a base in the bipolar operation. Thus, the base width is significantly increased, and hFE is reduced at this time, whereby a high holding voltage $V_h$ is maintained.

Figure 18:
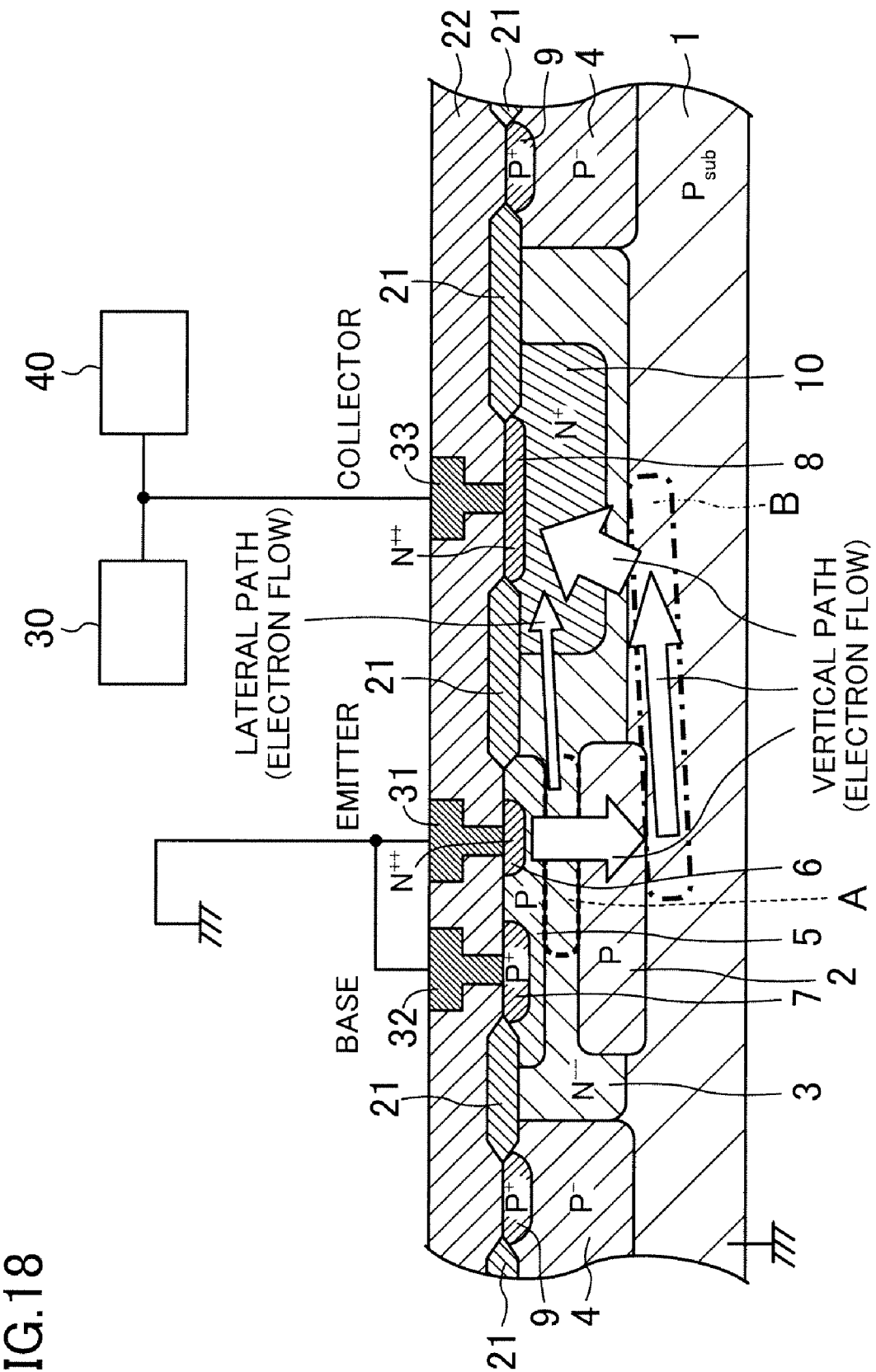
FIG. 18 is a cross-sectional view illustrating a current path after the electrostatic protection device of the second example embodiment has started the bipolar operation.

As shown in FIG. 18, if the current further increases thereafter, most of the current flows in the vertical direction as the distance in the vertical direction, namely the sum of the distances D1, D2, is shorter than the distance L in the lateral direction as described above, and thus the vertical resistance component is lower than the lateral resistance component. Accordingly, the lateral current component near the surface of the n-type low concentration diffusion layer 3 decreases, whereby current concentration is avoided. As a result, a breakdown current is increased, and breakdown endurance $I_{t2}$ is increased.

Since the n-type high concentration sink layer 10 has a greater depth than the base p-type diffusion layer 5, the distance D2 is shorter than in the first example embodiment. Thus, the structure of the second example embodiment further facilitates the vertical current flow. Since the n-type high concentration sink layer 10 has a high concentration, the n-type high concentration sink layer 10 is not neutralized even if a large current flows therein. Thus, the n-type high concentration sink layer 10 operates as a collector resistor.

According to the electrostatic protection device included in the semiconductor integrated circuit of the second example embodiment, since most of the current flows in the vertical direction, the current flowing in the lateral direction near the surface is reduced, and current concentration is avoided. Thus, the breakdown endurance can be increased.

In the electrostatic protection device of the second example embodiment, since the embedded p-type diffusion layer 2 is provided in the region below the emitter n-type high concentration diffusion layer 6, the breakdown endurance can be increased without increasing the area of the device. Moreover, since the base width is increased significantly in the bipolar operation, a high holding voltage $V_h$ can be maintained, and thus the electrostatic protection device of the second example embodiment is also advantageous in that it can be used for protection of high breakdown voltage elements.

Although the second example embodiment is described with respect to the example in which the n-type high concentration sink layer 10 does not extend to the lower end of the n-type low concentration diffusion layer 3, the n-type high concentration sink layer 10 may have a depth great enough to extend to the lower end of the n-type low concentration diffusion layer 3. In this case, the distance D2 is eliminated, and there is only the distance D1 in the vertical direction. Thus, the distance in the vertical direction can further be reduced as compared to the distance L in the lateral direction, whereby the breakdown endurance $I_{t2}$ can be increased accordingly. That is, the area of the device required to obtain the same breakdown endurance $I_{t2}$ can be reduced.

Figure 19:
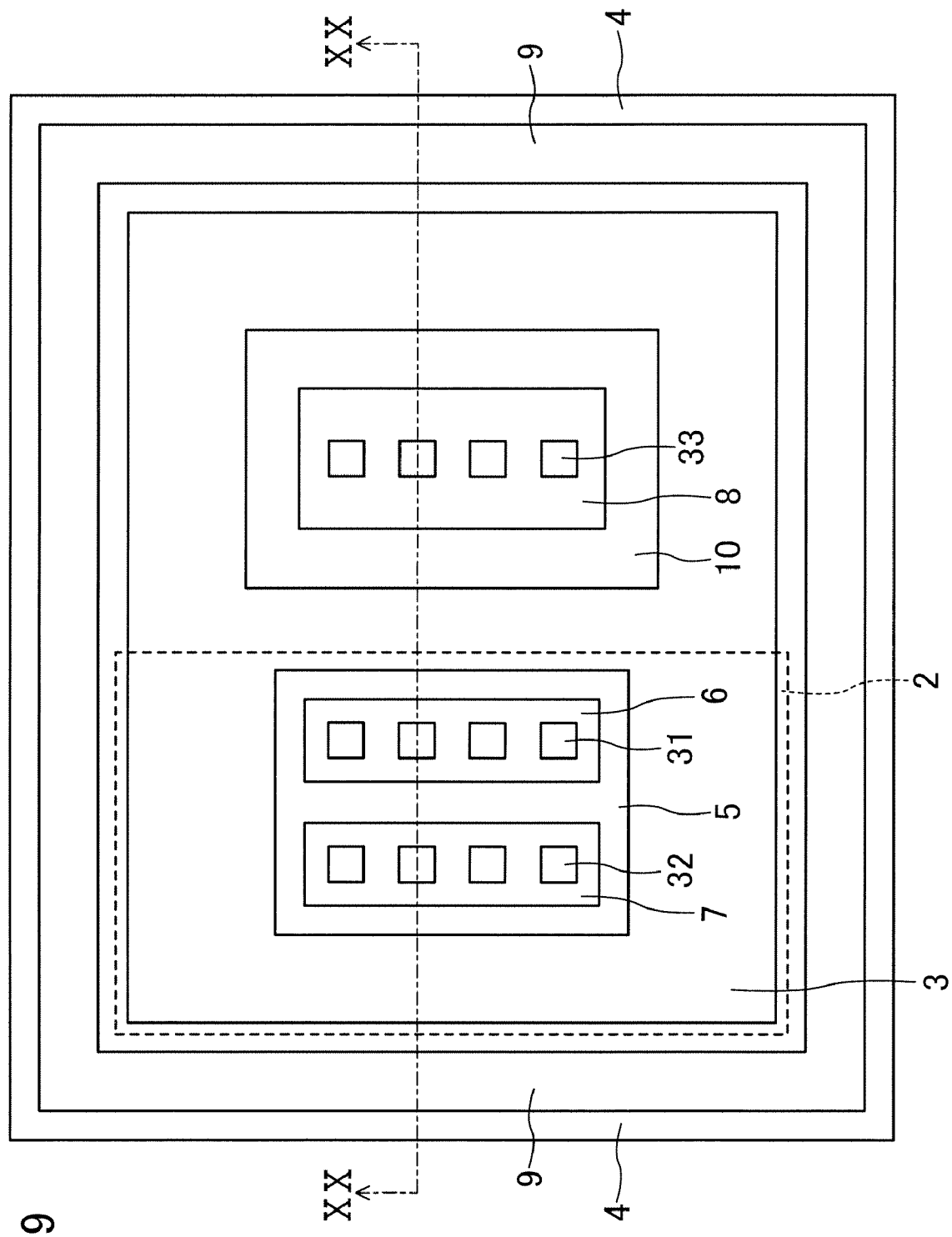
FIG. 19 is a plan view of an electrostatic protection device of a modification of the second example embodiment.
Figure 20:
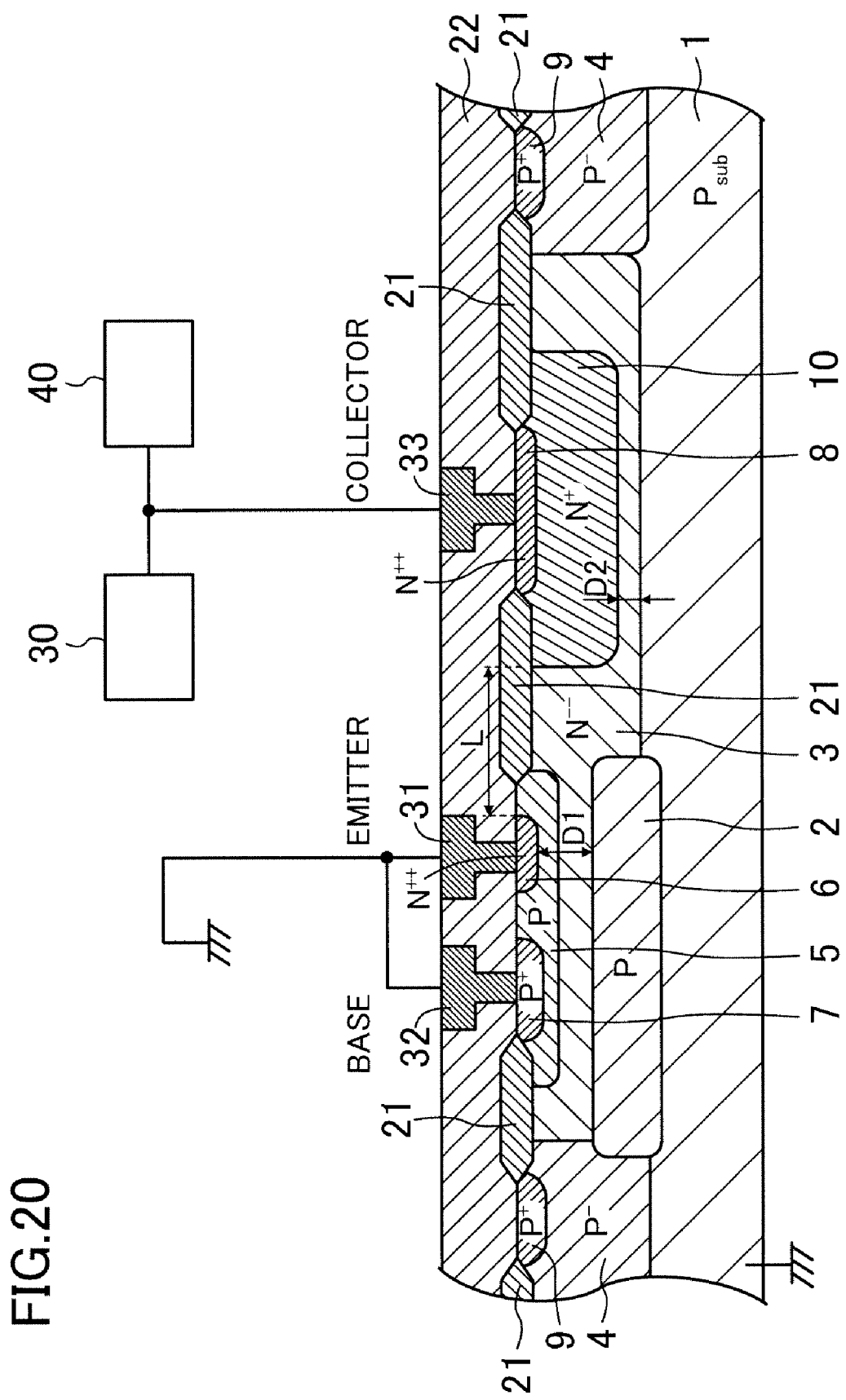
FIG. 20 is a cross-sectional view of the electrostatic protection device of the modification of the second example embodiment taken along line XX-XX in FIG. 19.
Figure 21:
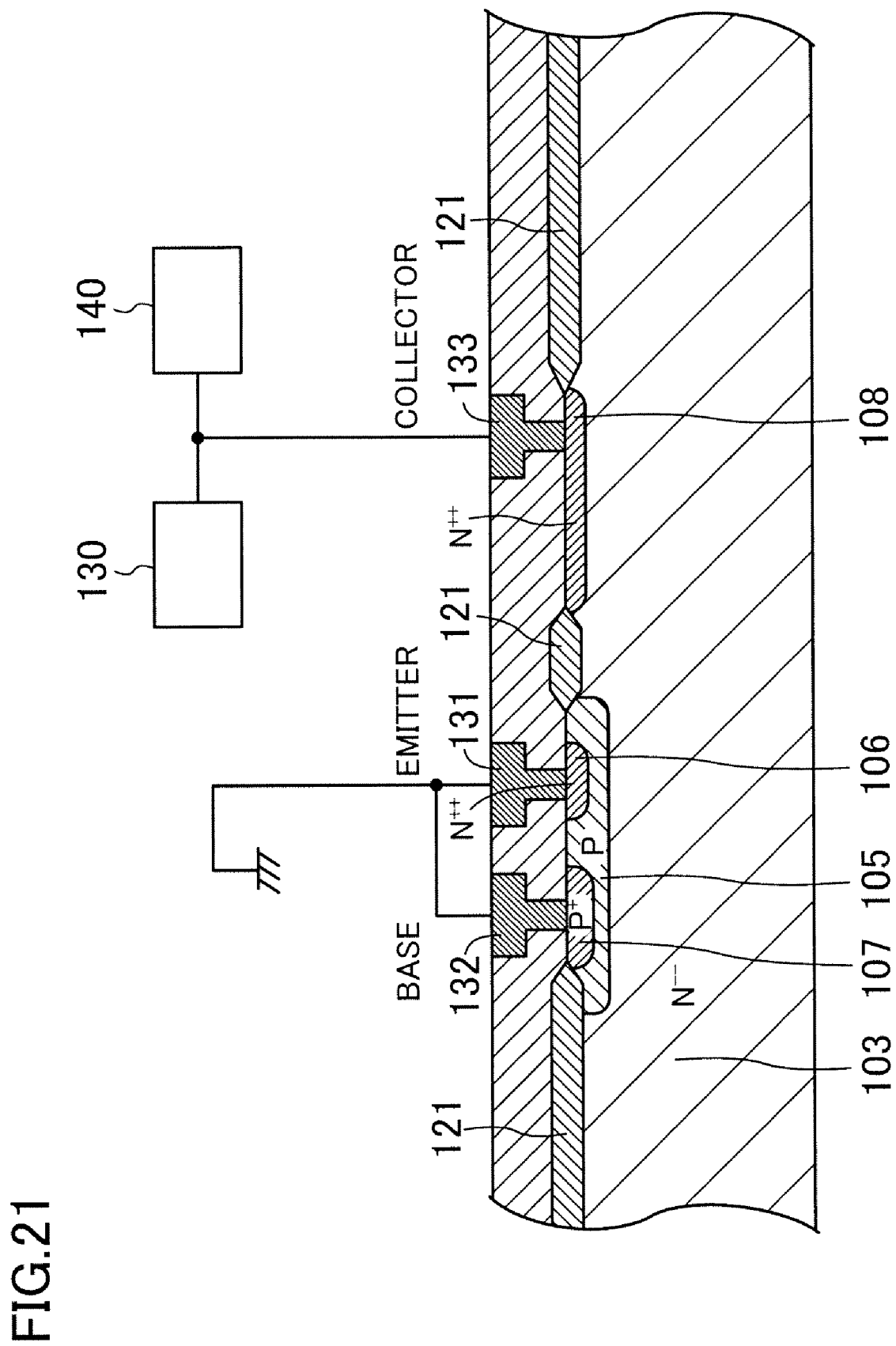
FIG. 21 is a cross-sectional view of a conventional electrostatic protection device.
Figure 22:
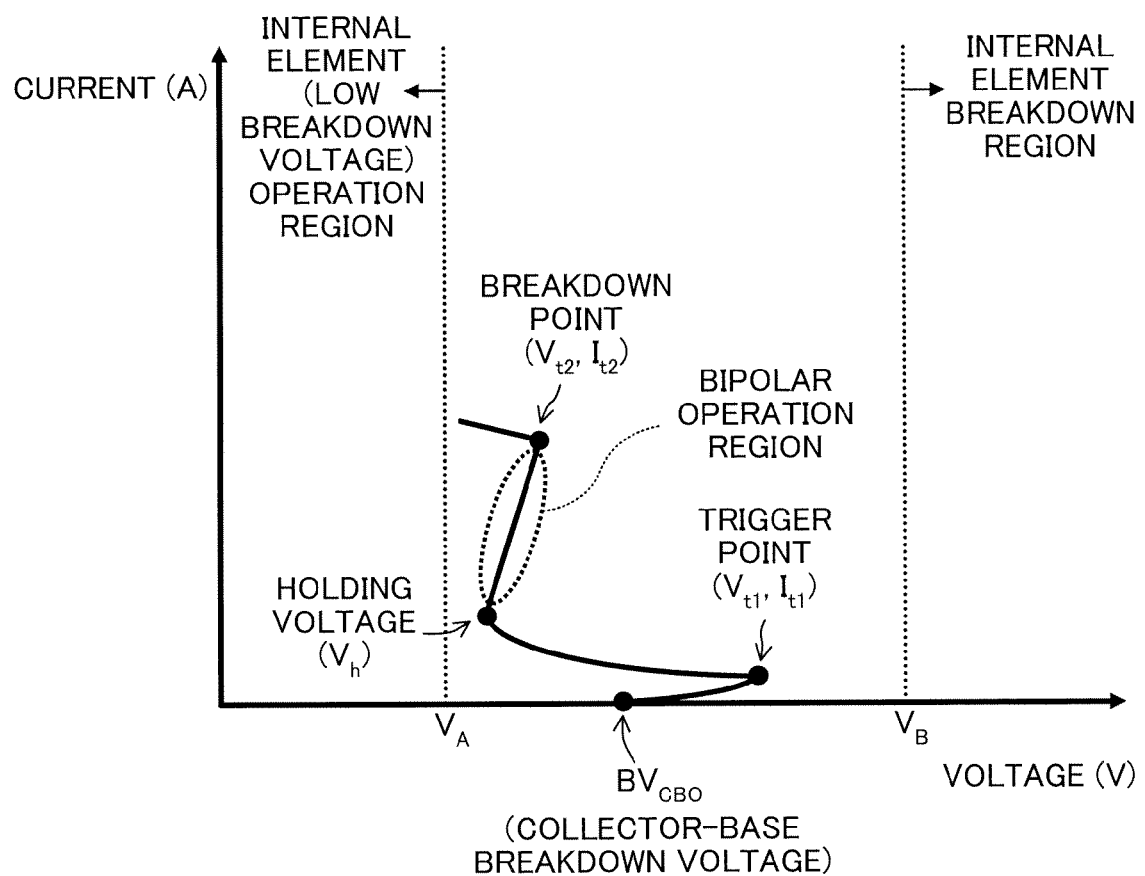
FIG. 22 is a graph showing voltage-current characteristics of the conventional electrostatic protection device.

Note that as shown in FIGS. 19-20, the embedded p-type diffusion layer 2 may be formed at a predetermined distance from the n-type high concentration sink layer 10 and in contact with the p-type diffusion layer 4 located on the opposite side from the n-type high concentration sink layer 10. If the junction breakdown voltage between the n-type high concentration sink layer 10 and the embedded p-type diffusion layer 2 is higher than that between the n-type high concentration sink layer 10 and the base p-type diffusion layer 5, the embedded p-type diffusion layer 2 may be formed in contact with the p-type diffusion layer 4 on both sides. That is, by providing the embedded p-type diffusion layer 2 in the region that facilitates the vertical current flow rather than the lateral current flow from the emitter n-type high concentration diffusion layer 6 to the n-type high concentration sink layer 10, current concentration near the surface of the n-type low concentration diffusion layer 3 can be reduced, and the breakdown endurance $I_{t2}$ can be increased.

Even with the electrostatic protection devices of the modifications of the second example embodiment, the breakdown endurance and the holding voltage can be increased without increasing the area of the device, as in the second example embodiment.

Note that in the bipolar transistor structure of the electrostatic protection device of the present invention, similar advantages can be obtained even if the bipolar transistor structure is used as a bipolar power transistor that is turned on/off by using separate base and emitter electrodes.

Even if n-type and p-type are reversed from the above configurations, the electrostatic protection device of the present invention can still be used as an electrostatic protection device, and can achieve the object of the present invention.

As described above, in the semiconductor integrated circuit of the present disclosure, the area is not increased to obtain an electrostatic protection device having a higher breakdown current and a higher holding voltage, and having higher protection capability, and the semiconductor integrated circuit of the present disclosure is especially useful for semiconductor integrated circuits including an electrostatic protection device, etc.

What is claimed is:

1. A semiconductor integrated circuit, comprising:
   a semiconductor substrate of a first conductivity type;
   a first diffusion layer of a second conductivity type formed on the semiconductor substrate or in an upper part of the semiconductor substrate;
   a second diffusion layer of the first conductivity type formed in an upper part of the first diffusion layer, and serving as a base;
   a third diffusion layer of the second conductivity type formed in an upper part of the second diffusion layer, and serving as an emitter;
   a fourth diffusion layer of the second conductivity type formed in the upper part of the first diffusion layer so as to be separated from the second diffusion layer, and serving as a collector contact; and
   a fifth diffusion layer of the first conductivity type formed at least below the third diffusion layer so as to be separated from the second diffusion layer in a depth direction, and so as to have a lower end located below a lower end of the first diffusion layer, wherein
   a sum of a shortest distance from the third diffusion layer to the fifth diffusion layer and a shorter one of a shortest distance from the fifth diffusion layer to the fourth diffusion layer and a shortest distance from the lower end of the first diffusion layer to the fourth diffusion layer is smaller than a shortest distance from the third diffusion layer to the fourth diffusion layer.

2. The semiconductor integrated circuit of claim 1, wherein the fifth diffusion layer is also formed below the fourth diffusion layer, and is not in contact with the fourth diffusion layer.

3. The semiconductor integrated circuit of claim 2, wherein the fifth diffusion layer comprises two portions which are formed below the third diffusion layer and below the fourth diffusion layer, and these two portions of the fifth diffusion layer are separated from each other by the first diffusion layer.

4. The semiconductor integrated circuit of claim 1, further comprising:
   an element isolation region formed around the first diffusion layer, and
   the fifth diffusion layer is in contact with the element isolation region.

5. The semiconductor integrated circuit of claim 1, wherein the fourth diffusion layer includes, below the collector contact, a region having a higher impurity concentration than the first diffusion layer.

6. The semiconductor integrated circuit of claim 1, wherein a sixth diffusion layer serving as a base contact is formed on an opposite lateral side of the third diffusion layer from the fourth diffusion layer in the upper part of the second diffusion layer so as to be separated from the third diffusion layer, and
   the sixth diffusion layer is of the first conductivity type, and has a higher impurity concentration than the second diffusion layer.

7. The semiconductor integrated circuit of claim 1, wherein the second diffusion layer and the third diffusion layer are electrically connected to a lowest potential, and the fourth diffusion layer is electrically connected to an input/output terminal or a power supply terminal, and an internal circuit.

8. The semiconductor integrated circuit of claim 1, wherein the first diffusion layer is formed on the semiconductor substrate by epitaxial growth.

9. The semiconductor integrated circuit of claim 1, wherein an oxide film is formed between the second diffusion layer and the fourth diffusion layer.

10. The semiconductor integrated circuit of claim 1, wherein the third diffusion layer and the fourth diffusion layer have a higher impurity concentration than the first diffusion layer.

* * * * *